(12) United States Patent
Sugiyama et al.

(10) Patent No.: US 7,800,038 B2
(45) Date of Patent: Sep. 21, 2010

(54) PHOTODETECTOR DEVICE

(75) Inventors: Yukinobu Sugiyama, Hamamatsu (JP); Seiichiro Mizuno, Hamamatsu (JP)

(73) Assignee: Hamamatsu Photonis K.K., Hamamatsu-shi, Shizuoka (JP)

( * ) Notice: Subject to any disclaimer, the term of this patent is extended or adjusted under 35 U.S.C. 154(b) by 363 days.

(21) Appl. No.: 10/588,154

(22) PCT Filed: Jan. 31, 2005

(86) PCT No.: PCT/JP2005/001356
§ 371 (c)(1),
(2), (4) Date: May 7, 2008

(87) PCT Pub. No.: WO2005/073683
PCT Pub. Date: Aug. 11, 2005

(65) Prior Publication Data
US 2009/0014627 A1    Jan. 15, 2009

(30) Foreign Application Priority Data
Feb. 2, 2004 (JP) .............................. 2004-025871

(51) Int. Cl.
G01J 1/44 (2006.01)
G01B 11/00 (2006.01)
H01L 27/146 (2006.01)
H01L 31/10 (2006.01)
H04N 5/335 (2006.01)

(52) U.S. Cl. ..................... 250/208.1; 348/302; 348/309

(58) Field of Classification Search .................. 352/85; 250/208.1; 348/294, 302, 303, 309
See application file for complete search history.

(56) References Cited

U.S. PATENT DOCUMENTS 6,455,837 B2 * 9/2002 Mizuno .................. 250/214 R
7,193,197 B2 * 3/2007 Sugiyama et al. ........ 250/208.1

(Continued)

FOREIGN PATENT DOCUMENTS

EP    1460839 A1 *  9/2004

(Continued)

*Primary Examiner*—John R Lee
(74) *Attorney, Agent, or Firm*—Drinker Biddle & Reath LLP

(57) ABSTRACT

The present invention relates to a photo-detecting apparatus capable of obtaining the intensity distribution of incident light at the same timing even when the intensity distribution of incident light may change with time. The photo-detecting apparatus comprises a photo-detecting section in which plural pixels are arranged in a two-dimensional array, and a signal processing section. Each of plural pixels constituting the photo-detecting section has a first photodiode and a second photodiode, N first photodiodes included in the group of pixels constituting the m-th row of the two-dimensional array being electrically connected to each other through multiple lines, while M second photodiodes included in the group of pixels constituting the n-th column of the two-dimensional array being electrically connected to each other through other multiple lines. The signal processing section includes M first readout circuits and N second readout circuits, and the signal processing section transfers an electric charge generated in the first photodiodes connected to the multiple lines into the first readout circuits to output voltage values in accordance with the charge quantity in the respective first readout circuits, while transferring an electric charge generated in the second photodiodes connected to the other multiple lines into the second readout circuits to output voltage values in accordance with the charge quantity in the respective second readout circuits.

2 Claims, 18 Drawing Sheets

U.S. PATENT DOCUMENTS

| | | | |
|---|---|---|---|
| 2001/0008422 A1* | 7/2001 | Mizuno et al. | 348/302 |
| 2002/0085104 A1* | 7/2002 | Mizuno et al. | 348/294 |
| 2002/0190193 A1* | 12/2002 | Mizuno et al. | 250/214 R |
| 2005/0041124 A1* | 2/2005 | Sugiyama et al. | 348/294 |
| 2006/0261245 A1* | 11/2006 | Sugiyama et al. | 250/208.1 |
| 2006/0273238 A1* | 12/2006 | Sugiyama et al. | 250/208.1 |
| 2009/0014627 A1* | 1/2009 | Sugiyama et al. | 250/208.1 |

FOREIGN PATENT DOCUMENTS

| | | |
|---|---|---|
| JP | 04-313278 | 11/1992 |
| JP | 4-341062 | 11/1992 |
| JP | 4-369268 | 12/1992 |
| JP | 05-013808 | 1/1993 |
| JP | 5-95514 | 4/1993 |
| JP | 08-168022 | 6/1996 |
| JP | 8-330560 | 12/1996 |
| JP | 2001-036128 | 2/2001 |
| JP | 2001-346104 | 12/2001 |
| JP | 2003-219278 | 7/2003 |
| JP | 2003189181 A * | 7/2003 |
| JP | 2003-329397 | 11/2003 |
| JP | 2005-33722 | 2/2005 |
| WO | WO 03/049190 | 6/2003 |

* cited by examiner

PHOTODETECTOR DEVICE

TECHNICAL FIELD

The present invention relates to a photo-detecting apparatus capable of detecting the intensity distribution of incident light in two directions that are at right angles to each other on a photo-detecting surface.

BACKGROUND ART

There has been known such a photo-detecting apparatus capable of detecting the intensity distribution of incident light in two directions that are at right angles to each other on a photo-detecting surface as disclosed in Patent Document 1. In the photo-detecting apparatus, a plurality of pixels are arranged in a two-dimensional array on the photo-detecting surface on the substrate, each pixel having a structure in which first and second photosensitive portions for outputting respective current values in accordance with the intensity of incident light are disposed adjacently to each other. In each column of the two-dimensional array, the first photosensitive portions included in the group of pixels constituting the column are electrically connected to each other through a common line, and current values to be output through the line provide information about the two-dimensional intensity distribution of incident light on the photo-detecting surface being accumulated in the column direction (i.e. the intensity distribution of incident light in the row direction). In each row of the two-dimensional array, the second photosensitive portions included in the group of pixels constituting the row are also electrically connected to each other through another common line, and current values to be output through the line provide information about the two-dimensional intensity distribution of incident light on the photo-detecting surface being accumulated in the row direction (i.e. the intensity distribution of incident light in the column direction). Thus, the intensity distribution of incident light in both the column and row directions on the photo-detecting surface can be obtained.

Patent Document 1: International Patent Publication No. WO03/049190

DISCLOSURE OF THE INVENTION

Problem to be Solved by the Invention

The inventors have studied conventional photo-detecting apparatuses in detail, and as a result, have found problems as follows. That is, when obtaining the intensity distribution of incident light in the column direction on the photo-detecting surface of the photo-detecting apparatus disclosed in Patent Document 1, current values output through each common line that connects the second photosensitive portions included in the group of pixels constituting each row are read out in chronological order, which suffers from a problem in that if the intensity distribution of incident light (e.g. peak intensity and/or peak position) changes with time, the intensity distribution of incident light in the column direction cannot be obtained at the same tiring. The same applies to the case of obtaining the intensity distribution of incident light in the row direction on the photo-detecting surface.

In order to overcome the above-mentioned problems, it is an object of the present invention to provide a photo-detecting apparatus capable of obtaining the intensity distribution of incident light at the same timing even when the intensity distribution of incident light may change with time.

Means for Solving Problem

A photo-detecting apparatus according to the present invention comprises a photo-detecting section and a signal processing section. The photo-detecting section has a plurality of pixels arranged in a two-dimensional array having M rows and N columns (M and N each represent an integer of 2 or more), a plurality of lines $L_{A,m}$ ("m" represents any integer of 1 to M) provided correspondingly for the respective rows in the two-dimensional array that is constituted by the plurality of pixels, and a plurality of lines $L_{B,n}$ ("n" represents any integer of 1 to N) provided correspondingly for the respective columns. Each of the plurality of pixels has a first photodiode $PD_{A,m,n}$ and a second photodiode $PD_{B,m,n}$. The plurality of lines $L_{A,m}$ are provided for the respective rows so that the N first photodiodes $PD_{A,m,1}$ to $PD_{A,m,N}$ included in the group of pixels constituting the m-th row of the two-dimensional array are electrically connected to each other through the line $L_{A,m}$. Also, the plurality of lines $L_{B,n}$ are provided for the respective columns so that the M second photodiodes $PD_{B,1,n}$ to $PD_{B,M,n}$ included in the group of pixels constituting the n-th column of the two-dimensional array are electrically connected to each other through the line $L_{B,n}$. The signal processing section includes M readout circuits $R_{A,1}$ to $R_{A,M}$ and N readout circuits $R_{B,1}$ to $R_{B,N}$. The signal processing section transfers an electric charge generated in the first photodiode $PD_{A,m,n}$ connected to the Line $L_{A,m}$ into the readout circuit $R_{A,m}$ to output a voltage value in accordance with the charge quantity in the readout circuit $R_{A,m}$, while transferring an electric charge generated in the second photodiode $PD_{B,m,n}$ connected to the line $L_{B,n}$ into the readout circuit $R_{B,n}$ to output a voltage value in accordance with the charge quantity in the readout circuit $R_{B,n}$.

In the photo-detecting section of the photo-detecting apparatus, the plurality of pixels are arranged in a two-dimensional array having M rows and N columns, and the pixel in the m-th row and the n-th column has the first photodiode $PD_{A,m,n}$ and the second photodiode $PD_{B,m,n}$. When light enters the photo-detecting section, the first photodiode $PD_{A,m,n}$ and the second photodiode $PD_{B,m,n}$ included in the pixel at the light incident position generate an electric charge. The electric charge generated in the first photodiode $PD_{A,m,n}$ is to be transferred and held in the readout circuit $R_{A,m}$ through the line $L_{A,m}$ to output a voltage value $V_{A,m}$ in accordance with the charge quantity held in the readout circuit $R_{A,m}$. Also, the electric charge generated in the second photodiode $PD_{B,m,n}$ is to be transferred and held in the readout circuit $R_{B,n}$ through the line $L_{B,n}$ to output a voltage value $V_{B,n}$ in accordance with the charge quantity held in the readout circuit $R_{B,n}$. Meanwhile, in the signal processing section, the readout circuit $R_{A,m}$ is provided correspondingly for the m-th row among the plurality of pixels arranged in a two-dimensional array having M rows and N columns, the M readout circuits $R_{A,1}$ to $R_{A,M}$ being operable at the same timing. Also, the readout circuit $R_{B,n}$ is provided correspondingly for the n-th column, the N readout circuits $R_{B,1}$ to $R_{B,N}$ being operable at the same timing. Therefore, the photo-detecting apparatus according to the present invention can obtain the intensity distribution of incident light at the same timing even when the intensity distribution of incident light may change with time.

Each of the readout circuit $R_{A,m}$ and the readout circuit $R_{B,n}$ has a capacitive section for holding an electric charge, amplifying means for outputting a voltage value in accordance with the charge quantity held in the capacitive section, transfer means for transferring an electric charge generated in a photodiode to the capacitive section; and discharge means for discharging an electric charge in the capacitive section. In this case, in each of the readout circuits $R_{A,m}$ and $R_{B,n}$, electric charge generated in a photodiode is transferred by the transfer means to the capacitive section through a line and held in the capacitive section. Then, the amplifying means outputs a voltage value in accordance with the charge quantity held in the capacitive section. Also, the discharge means discharges the electric charge in the capacitive section. It is noted that the capacitive section may be made intentionally as a capacitive element, or when each of the amplifying means, transfer means, and discharge means are constituted by transistors, the capacitive section may be a gate, drain, or source capacitance of the transistors or wiring capacitance, or further may be any combination thereof.

Each of the first photodiode $PD_{A,m,n}$ and the second photodiode $PD_{B,m,n}$ preferably includes a first semiconductor region with a first conductive-type, a second semiconductor region with a second conductive-type provided on the first semiconductor region with the first conductive-type so as to form a pn junction with first semiconductor region of the first conductive-type; and a third semiconductor region with the first conductive-type provided on the second semiconductor region and the periphery thereof so as to form a pn junction with the second semiconductor region of the second conductive-type. When the photodiodes are buried ones as above, there can be no contact between a depletion layer and an interface between a semiconductor region and an insulating layer, which reduces the occurrence of leak current due to disturbance of the crystal structure in the interface between the semiconductor region and the insulating layer, resulting in a high S/N ratio of light detection.

The signal processing section may further include M holding circuits $H_{A,1,1}$ to $H_{A,M,1}$, M holding circuits $H_{A,1,2}$ to $H_{A,M,2}$, N holding circuits $H_{B,1,1}$ to $H_{B,N,1}$, N holding circuits $H_{B,1,2}$ to $H_{B,N,2}$, a first subtracting circuit, and a second subtracting circuit. In this case, one of the holding circuit $H_{A,m,1}$ and the holding circuit $H_{A,m,2}$ holds a voltage value to be outputted from the readout circuit $R_{A,m}$, and one of the holding circuit $H_{B,n,1}$ and the holding circuit $H_{B,n,2}$ holds a voltage value to be outputted from the readout circuit $R_{B,n}$. Also, the first subtracting circuit receives a voltage value $V_{A,m,1}$ to be outputted from the holding circuit $H_{A,m,1}$ and a voltage value $V_{A,m,2}$ to be outputted from the holding circuit $H_{A,m,2}$ to output a voltage value representing the difference between the voltage values ($V_{A,m,1}-V_{A,m,2}$). Then, the second subtracting circuit receives a voltage value $V_{B,n,1}$ to be outputted from the holding circuit $H_{B,n,1}$ and a voltage value $V_{B,n,2}$ to be outputted from the holding circuit $H_{B,n,2}$ to output a voltage value representing the difference between the voltage values ($V_{B,n,1}-V_{B,n,2}$).

In the case above, the signal processing section is sectionalized into a first signal processing section and a second signal processing section. That is, the first signal processing section includes the M readout circuits $R_{A,1}$ to $R_{A,M}$, the M holding circuits $H_{A,1,1}$ to $H_{A,M,1}$, the M holding circuits $H_{A,1,2}$ to $H_{A,M,2}$, and the first subtracting circuit. On the other hand, the second signal processing section includes the N readout circuits $R_{B,1}$ to $R_{B,N}$, the N holding circuits $H_{B,1,1}$ to $H_{B,N,1}$, the N holding circuits $H_{B,1,2}$ to $H_{B,N,2}$, and the second subtracting circuit. Then, in the first signal processing section, one of the holding circuit $H_{A,m,1}$ and the holding circuit $H_{A,m,2}$ holds a voltage value to be outputted from the readout circuit $R_{A,m}$, and the first subtracting circuit outputs a voltage value representing the difference between a voltage value $V_{A,m,1}$ to be outputted from the holding circuit $H_{A,m,1}$ and a voltage value $V_{A,m,2}$ to be outputted from the holding circuit $H_{A,m,2}$ ($V_{A,m,1}-V_{A,m,2}$). On the other hand, in the second signal processing section, one of the holding circuit $H_{B,n,1}$ and the holding circuit $H_{B,n,2}$ holds a voltage value to be outputted from the readout circuit $R_{B,n}$, and the second subtracting circuit outputs a voltage value representing the difference between a voltage value $V_{B,n,1}$ to be outputted from the holding circuit $H_{B,n,1}$ and a voltage value $V_{B,n,2}$ to be outputted from the holding circuit $H_{B,n,2}$ ($V_{B,n,1}-V_{B,n,2}$). In this arrangement, the first and second signal processing sections can be operated in parallel.

The signal processing section may further include M holding circuits $H_{A,1,1}$ to $H_{A,M,1}$, M holding circuits $H_{A,1,2}$ to $H_{A,M,2}$, N holding circuits $H_{B,1,1}$ to $H_{B,N,1}$, N holding circuits $H_{B,1,2}$ to $H_{B,N,2}$, and a subtracting circuit. In this case, one of the holding circuit $H_{A,m,1}$ and the holding circuit $H_{A,m,2}$ holds a voltage value to be outputted from the readout circuit $R_{A,m}$, and one of the holding circuit $H_{B,n,1}$ and the holding circuit $H_{B,2,n}$ holds a voltage value to be outputted from the readout circuit $R_{B,n}$. Also, the subtracting circuit receives a voltage value $V_{A,m,1}$ to be outputted from the holding circuit $H_{A,m,1}$ and a voltage value $V_{A,m,2}$ to be outputted from the holding circuit $H_{A,m,2}$ to output a voltage value representing the difference between the voltage values ($V_{A,m,1}-V_{A,m,2}$) as well as receiving a voltage value $V_{B,n,1}$ to be outputted from the holding circuit $H_{B,n,1}$ and a voltage value $V_{B,n,2}$ to be outputted from the holding circuit $H_{B,n,2}$ to output a voltage value representing the difference between the voltage values ($V_{B,n,1}-V_{B,n,2}$).

In the case above, one of the holding circuit $H_{A,m,1}$ and the holding circuit $H_{A,m,2}$ holds a voltage value to be outputted from the readout circuit $R_{A,m}$, and one of the holding circuit $H_{B,n,1}$ and the holding circuit $H_{B,n,2}$ holds a voltage value to be outputted from the readout circuit $R_{B,n}$. Also, the subtracting circuit outputs a voltage value representing the difference between a voltage value $V_{A,m,1}$ to be outputted from the holding circuit $H_{A,m,1}$ and a voltage value $V_{A,m,2}$ to be outputted from the holding circuit $H_{A,m,2}$ ($V_{A,m,1}-V_{A,m,2}$) as well as outputting a voltage value representing the difference between a voltage value $V_{B,n,1}$ to be outputted from the holding circuit $H_{B,n,1}$ and a voltage value $V_{B,n,2}$ to be outputted from the holding circuit $H_{B,n,2}$ ($V_{B,n,1}-V_{B,n,2}$).

The signal processing section may further include M holding circuits $H_{A,1,1}$ to $H_{A,M,1}$, M holding circuits $H_{A,1,2}$ to $H_{A,M,2}$, holding circuits $H_{A,1,3}$ to $H_{A,M,3}$, M holding circuits $H_{A,1,4}$ to $H_{A,M,4}$, N holding circuits $H_{B,1,1}$ to $H_{B,N,1}$, N holding circuits $H_{B,1,2}$ to $H_{B,N,2}$, N holding circuits $H_{B,1,3}$ to $H_{B,N,3}$, N holding circuits $H_{B,1,4}$ to $H_{B,N,4}$, a first adding and subtracting circuit, and a second adding and subtracting circuit. In this case, one of the holding circuit $H_{A,m,1}$, the holding circuit $H_{A,m,2}$, the holding circuit $H_{A,m,3}$, and the holding circuit $H_{A,m,4}$ holds a voltage value to be outputted from the readout circuit $R_{A,m}$, and one of the holding circuit $H_{B,n,1}$, the holding circuit $H_{B,n,2}$, the holding circuit $H_{B,n,3}$, and the holding circuit $H_{B,n,4}$ holds a voltage value to be outputted from the readout circuit $R_{B,n}$. Also, the first adding and subtracting circuit receives a voltage value $V_{A,m,1}$ to be outputted from the holding circuit $H_{A,m,1}$, a voltage value $V_{A,m,2}$ to be outputted from the holding circuit $H_{A,m,2}$, a voltage value $V_{A,m,2}$ to be outputted from the holding circuit $H_{A,m,3}$, and a voltage value $V_{A,m,4}$ to be outputted from the holding circuit $H_{A,m,4}$ to output a voltage value representing the addition and subtraction of the voltage values (($V_{A,m,3}-V_{A,m,4}$)$-$($V_{A,m,1}-V_{A,m,2}$)). Then, the second adding and subtracting circuit receives a voltage value $V_{B,n,1}$ to be outputted from the holding circuit $H_{B,n,1}$, a voltage value $V_{B,n,2}$ to be outputted from the holding circuit $H_{B,n,2}$, a voltage value $V_{B,n,3}$ to be outputted from the holding circuit $H_{B,n,3}$, and a voltage value $V_{B,n,4}$ to be outputted from the holding circuit $H_{B,n,4}$ to output a voltage value representing the addition and subtraction of the voltage values $((V_{B,n,3}-V_{B,n,4})-(V_{B,n,1}-V_{B,n,2}))$.

In the case above, the signal processing section is sectionalized into a first signal processing section and a second signal processing section. That is, the first signal processing section includes the M readout circuits $R_{A,1}$ to $R_{A,M}$, the M holding circuits $H_{A,1,1}$ to $H_{A,M,1}$, the M holding circuits $H_{A,1,2}$ to $H_{A,M,2}$, the M holding circuits $H_{A,1,3}$ to $H_{A,M,3}$, the M holding circuits $H_{A,1,4}$ to $H_{A,M,4}$, and the first adding and subtracting circuit. On the other hand, the second signal processing section includes the N readout circuits $R_{B,1}$ to $R_{B,N}$, the N holding circuits $H_{B,1,1}$ to $H_{B,N,1}$, the N holding circuits $H_{B,1,2}$ to $H_{B,N,2}$, the N holding circuits $H_{B,1,3}$ to $H_{B,N,3}$, the N holding circuits $H_{B,1,4}$ to $H_{B,N,4}$, and the second adding and subtracting circuit. In the first signal processing section, one of the holding circuits $H_{A,m,1}$ to $H_{A,m,4}$ holds a voltage value to be outputted from the readout circuit $R_{A,m}$. The first adding and subtracting circuit outputs a voltage value representing the addition and subtraction of a voltage value $V_{A,m,1}$ to be outputted from the holding circuit $H_{A,m,1}$, a voltage value $V_{A,m,2}$ to be outputted from the holding circuit $H_{A,m,2}$, a voltage value $V_{A,m,3}$ to be outputted from the holding circuit $H_{A,m,2}$, and a voltage value $V_{A,m,4}$ to be outputted from the holding circuit $H_{A,m,4}$ $((V_{A,m,3}-V_{A,m,4})-(V_{A,m,2}))$. On the other hand, in the second signal processing section, one of the holding circuits $H_{B,n,1}$ to $H_{B,n,4}$ holds a voltage value to be outputted from the readout circuit $R_{B,n}$. Then, the second adding and subtracting circuit outputs a voltage value representing the addition and subtraction of a voltage value $V_{B,n,1}$ to be outputted from the holding circuit $H_{B,n,1}$, a voltage value $V_{B,n,2}$ to be outputted from the holding circuit $H_{B,n,2}$, a voltage value $V_{B,n,3}$ to be outputted from the holding circuit $H_{B,n,3}$, and a voltage value $V_{B,n,4}$ to be outputted from the holding circuit $H_{B,n,4}$ $((V_{B,n,3}-V_{B,n,4})-(V_{B,n,1}-V_{B,n,2}))$. In this arrangement, the first and second signal processing sections can be operated in parallel.

The signal processing section may further include M holding circuits $H_{A,1,1}$ to $H_{A,M,1}$, M holding circuits $H_{A,1,2}$ to $H_{A,M,2}$, M holding circuits $H_{A,1,3}$ to $H_{A,M,3}$, M holding circuits $H_{A,1,4}$ to $H_{A,M,4}$, N holding circuits $H_{B,1,1}$ to $H_{B,N,1}$, N holding circuits $H_{B,1,2}$ to $H_{B,N,2}$, N holding circuits $H_{B,1,3}$ to $H_{B,N,3}$, N holding circuits $H_{B,1,4}$ to $H_{B,N,4}$, and an adding and subtracting circuit. In this case, one of the holding circuit $H_{A,m,1}$, the holding circuit $H_{A,m,2}$, the holding circuit $H_{A,m,3}$, and the holding circuit $H_{A,m,4}$ holds a voltage value to be outputted from the readout circuit $R_{A,m}$, and one of the holding circuit $H_{B,n,1}$, the holding circuit $H_{B,n,2}$, the holding circuit $H_{B,n,3}$, and the holding circuit $H_{B,n,4}$ holds a voltage value to be outputted from the readout circuit $R_{B,n}$. Then, the adding and subtracting circuit receives a voltage value $V_{A,m,1}$ to be outputted from the holding circuit $H_{A,m,1}$, a voltage value $V_{A,m,2}$ to be outputted from the holding circuit $H_{A,m,2}$, a voltage value $V_{A,m,3}$ to be outputted from the holding circuit $H_{A,m,3}$, and a voltage value $V_{A,m,4}$ to be outputted from the holding circuit $H_{A,m,4}$ to output a voltage value representing the addition and subtraction of the voltage values $((V_{A,m,3}-V_{A,m,4})-(V_{A,m,1}-V_{A,m,2}))$ as well as receiving a voltage value $V_{B,n,1}$ to be outputted from the holding circuit $H_{B,n,1}$, a voltage value $V_{B,n,2}$ to be outputted from the holding circuit $H_{B,n,2}$, a voltage value $V_{B,n,3}$ to be outputted from the holding circuit $H_{B,n,3}$, and a voltage value $V_{B,n,4}$ to be outputted from the holding circuit $H_{B,n,4}$ to output a voltage value representing the addition and subtraction of the voltage values $((V_{B,n,3}-V_{B,n,4})-(V_{B,n,1}-V_{B,n,2}))$.

In the case above, one of the holding circuits $H_{A,m,1}$ to $H_{A,m,4}$ holds a voltage value to be outputted from the readout circuit $R_{A,m}$, while one of the holding circuits $H_{B,n,1}$ to $H_{B,n,4}$ holds a voltage value to be outputted from the readout circuit $R_{B,n}$. Also, the adding and subtracting circuit outputs a voltage value representing the addition and subtraction of a voltage value $V_{A,m,1}$ to be outputted from the holding circuit $H_{A,m,1}$, a voltage value $V_{A,m,2}$ to be outputted from the holding circuit $H_{A,m,2}$, a voltage value $V_{A,m,3}$ to be outputted from the holding circuit $H_{A,m,3}$, and a voltage value $V_{A,m,4}$ to be outputted from the holding circuit $H_{A,m,4}$ $((V_{A,m,3}-V_{A,m,4})-(V_{A,m,1}-V_{A,m,2}))$ as well as outputting a voltage value representing the addition and subtraction of a voltage value $V_{B,n,1}$ to be outputted from the holding circuit $H_{B,n,1}$, a voltage value $V_{B,n,2}$ to be outputted from the holding circuit $H_{B,n,2}$, a voltage value $V_{B,n,3}$ to be outputted from the holding circuit $H_{B,n,3}$, and a voltage value $V_{B,n,4}$ to be outputted from the holding circuit $H_{B,n,4}$ $((V_{B,n,3}-V_{B,n,4})-(V_{B,n,1}-V_{B,n,2}))$.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

EFFECT OF THE INVENTION

In accordance with the present invention, it is possible to obtain the intensity distribution of incident light at the same timing even when the intensity distribution of incident light may change with time.

Figure 1:
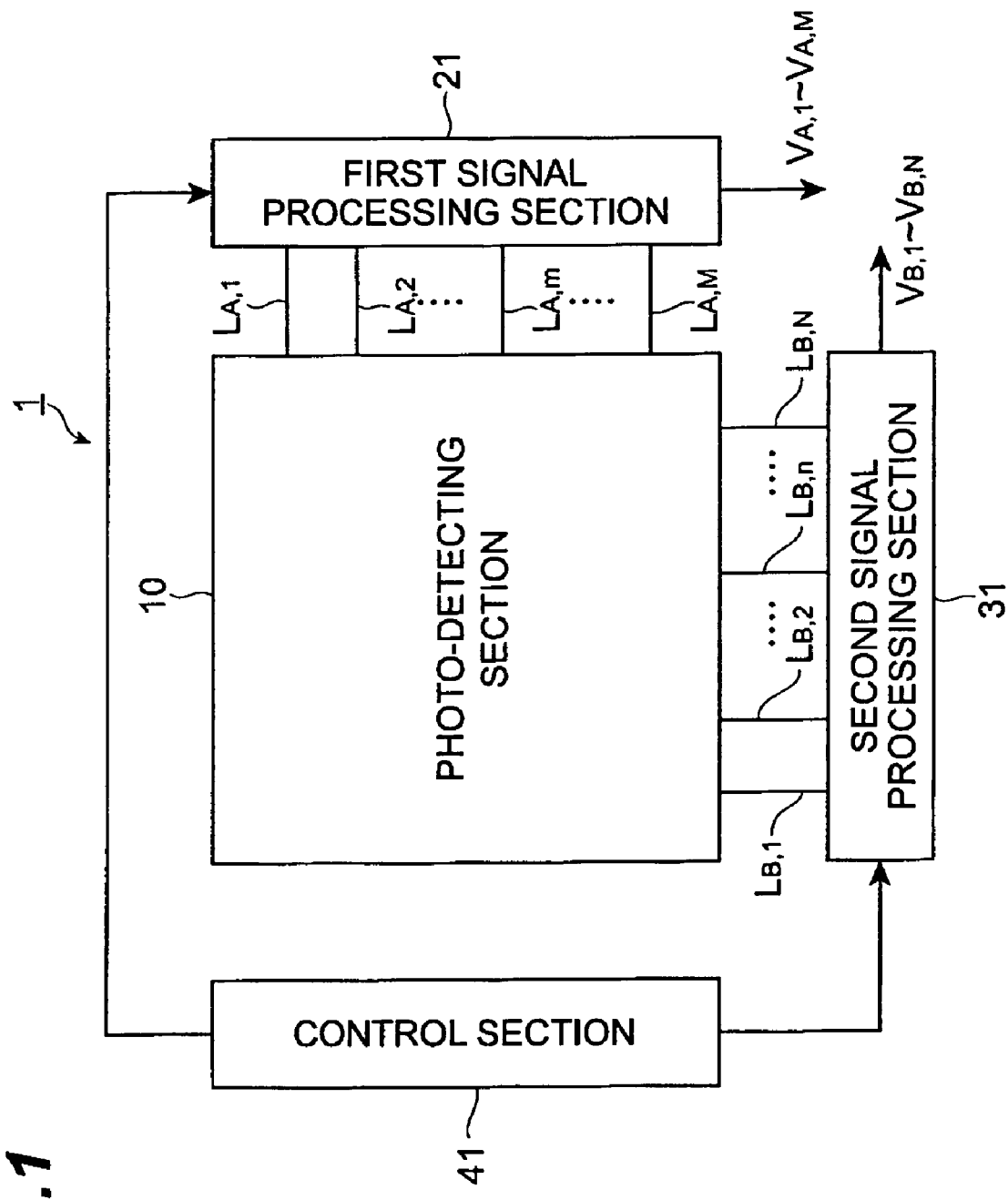
FIG. 1 is a view showing the schematic configuration of a first embodiment of a photo-detecting apparatus according to the present invention.

DESCRIPTION OF THE REFERENCE NUMERALS 1-4 . . . photo-detecting apparatuses; 10 . . . photo-detecting section; 21, 23 . . . first signal processing section; 22, 24 . . . signal processing section; 31, 33 . . . second signal processing section; and 41-44 . . . control section.

BEST MODES FOR CARRYING OUT THE INVENTION

In the following, embodiments of a photo-detecting apparatus according to the present invention will be explained in detail with reference to FIGS. 1 to 18. In the explanation of the drawings, constituents identical to each other will be referred to with numerals identical to each other without repeating their overlapping descriptions.

First Embodiment

A first embodiment of a photo-detecting apparatus according to the present invention will first be explained. FIG. 1 is a view showing the schematic configuration of the photo-detecting apparatus 1 according to the first embodiment. As shown in FIG. 1, the photo-detecting apparatus 1 comprises a photo-detecting section 10, a first signal processing section 21, a second signal processing section 31, and a control section 41. In the photo-detecting section 10, a plurality of pixels are arranged in a two-dimensional array having M rows and N columns. The first signal processing section 21 is electrically connected to the photo-detecting section 10 through M lines $L_{A,1}$ to $L_{A,M}$ and holds an electric charge to be transferred from photodiodes in the photo-detecting section 10 through each line $L_{A,m}$ as well as outputting a voltage value $V_{A,m}$ in accordance with the thus held charge quantity. The second signal processing section 31 is electrically connected to the photo-detecting section 10 through N lines $L_{B,1}$ to $L_{B,N}$ and holds an electric charge to be transferred from photodiodes in the photo-detecting section 10 through each line $L_{B,n}$ as well as outputting a voltage value $V_{B,n}$ according to the thus held charge quantity. The control section 41 controls the operation of the first and second signal processing sections 21 and 31. It is noted that M and N each represent an integer of 2 or more, "m" represents any integer of 1 to M, and "n" represents any integer of 1 to N.

Figure 2:
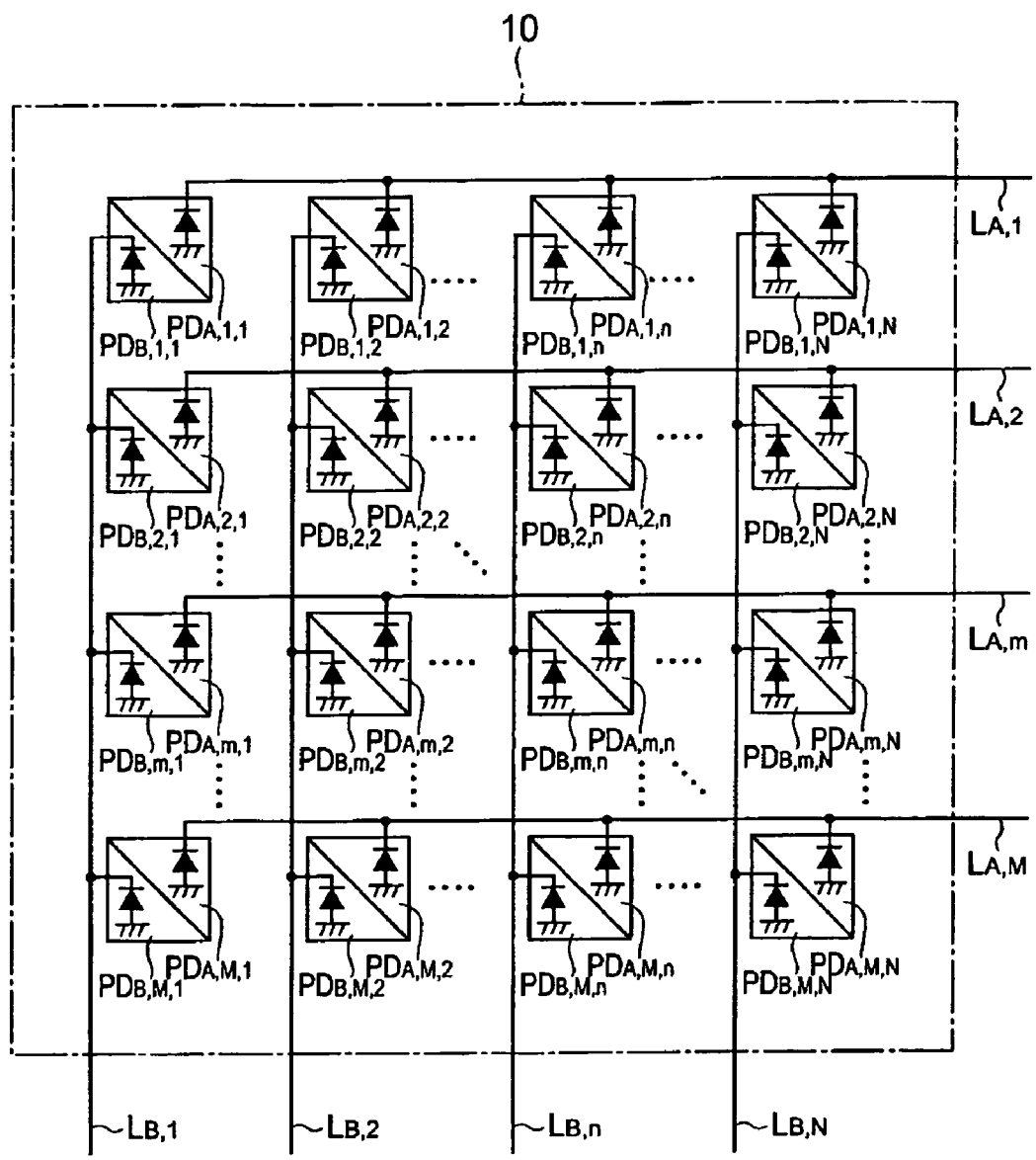
FIG. 2 is a view showing the configuration of a photo-detecting section.

FIG. 2 is a view showing the configuration of the photo-detecting section 10. As shown in FIG. 2, M×N pixels are arranged in a two-dimensional array having M rows and N columns in the photo-detecting section 10, and the pixel in the m-th row and the n-th column has photodiodes $PD_{A,m,n}$ and $PD_{B,m,n}$. The photodiodes $PD_{A,m,n}$ and $PD_{B,m,n}$ are disposed adjacently to each other in the same plane and the anode terminals thereof have a ground potential. The cathode terminals of the N photodiodes $PD_{A,m,1}$ to $PD_{A,m,N}$ included in the group of pixels constituting the m-th row are electrically connected to each other through the line $L_{A,m}$. Also, the cathode terminals of the M photodiodes $PD_{B,1,n}$ to $PD_{B,M,n}$ included in the group of pixels constituting the n-th column are electrically connected to each other through the line $L_{B,n}$.

Figure 3:
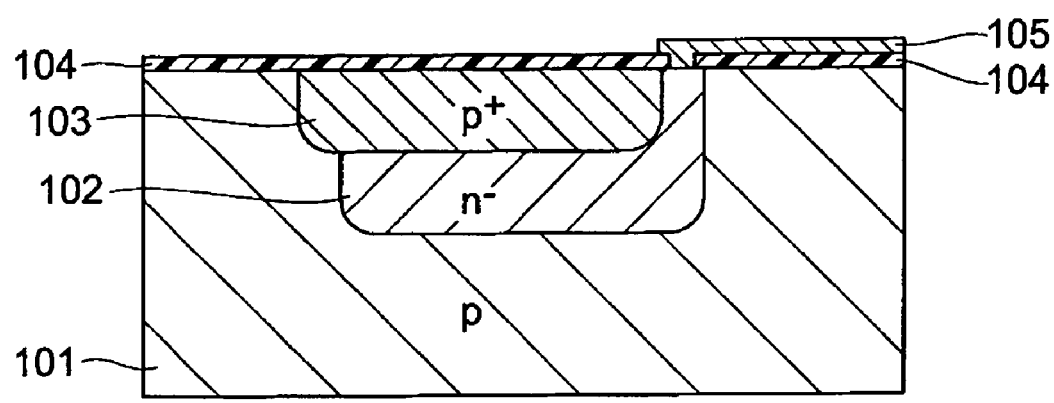
FIG. 3 is a cross-sectional view showing the structure of a photodiode.

FIG. 3 is a view showing the cross-sectional structure of a photodiode. The photodiodes $PD_{A,m,n}$ and $PD_{B,m,n}$ are preferably buried ones as shown in FIG. 3. That is, each of these photodiodes has a first semiconductor region 101 with p-type; a second semiconductor region 102 with n-type provided on the first semiconductor region 101 with p-type to form a pn junction with the first semiconductor region 101 with p-type, and a third semiconductor region 103 with $p^+$-type provided on the second semiconductor region 102 and the periphery thereof to form a pn junction with the second semiconductor region 102. Also, an insulating layer 104 is provided on these semiconductor regions and the second semiconductor region 102 is electrically connected with a metal layer 105. It is noted that the metal layer 105 corresponds to the line $L_{A,m}$ or $L_{B,n}$. When the photodiodes are buried ones as above, there can be no contact with an interface between a semiconductor region and an insulating layer, which reduces the occurrence of leak current due to disturbance of the crystal structure in the interface between the semiconductor region and the insulating layer, resulting in a high S/N ratio of light detection.

Figure 4:
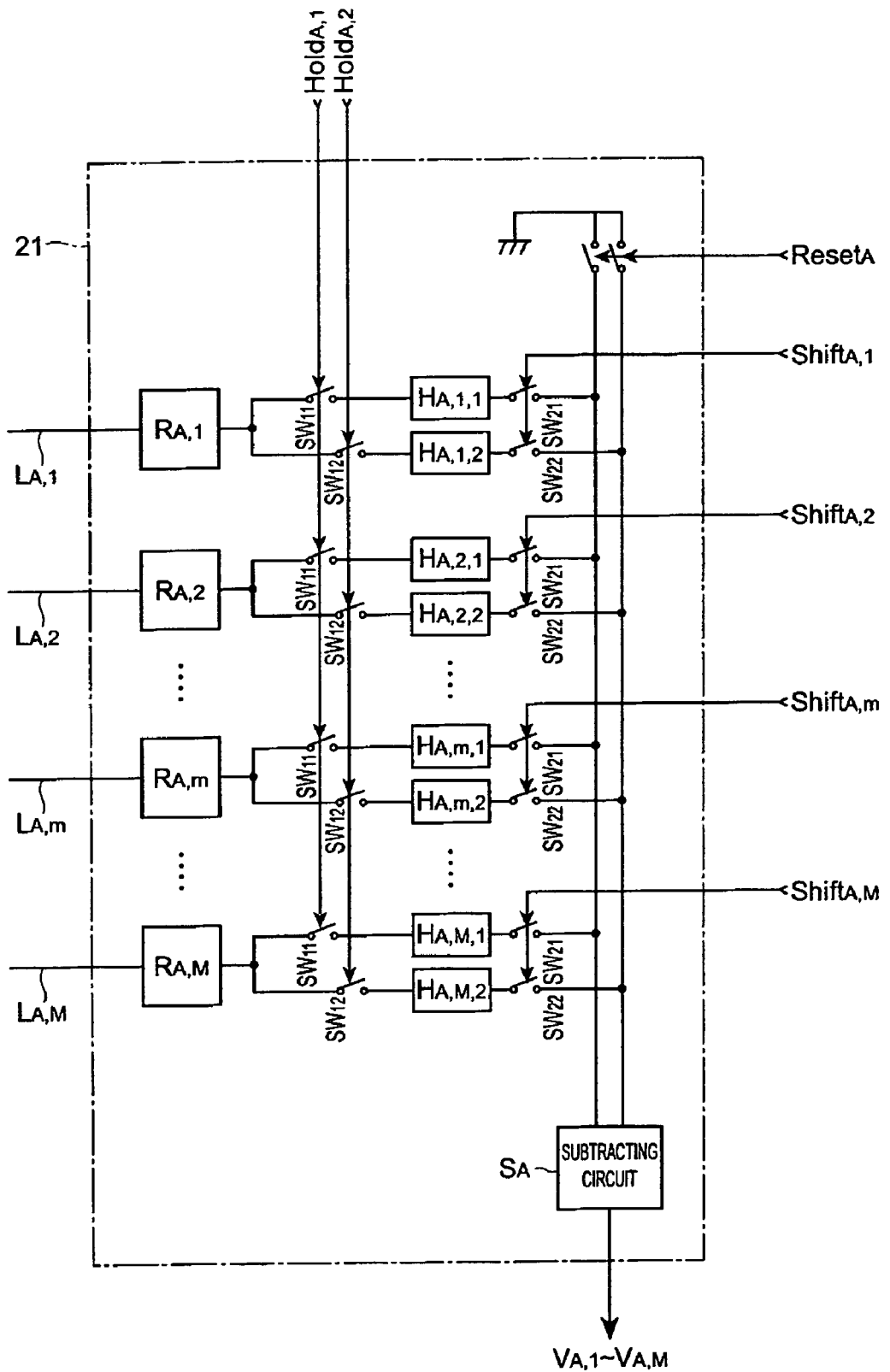
FIG. 4 is a view showing the configuration of a first signal processing section in the photo-detecting apparatus according to the first embodiment.

FIG. 4 is a view showing the configuration of the first signal processing section 21 in the photo-detecting apparatus 1 according to the first embodiment. The first signal processing section 21 includes M readout circuits $R_{A,1}$ to $R_{A,M}$, holding circuits $H_{A,1,1}$ to $H_{A,M,1}$, M holding circuits $H_{A,1,2}$ to $H_{A,M,2}$, and a subtracting circuit $S_A$. The readout circuit $R_{A,m}$ is connected to the line $L_{A,m}$ and holds an electric charge to be transferred from the photodiode $PD_{A,m,n}$ through the line $L_{A,m}$ as well as outputting a voltage value according to the thus held charge quantity.

The input terminal of the holding circuit $H_{A,m,1}$ is connected to the output terminal of the readout circuit $R_{A,m}$ via a switch $SW_{11}$ and holds a voltage value to be outputted from the readout circuit $R_{A,m}$ when the switch $SW_{11}$ is closed, as well as outputting the thus held voltage value. Also, the output terminal of the holding circuit $H_{A,m,1}$ is connected to the first input terminal of the subtracting circuit $S_A$ via a switch $SW_{21}$.

The input terminal of the holding circuit $H_{A,m,2}$ is connected to the output terminal of the readout circuit $R_{A,m}$ via a switch $SW_{12}$ and holds a voltage value to be outputted from the readout circuit $R_{A,m}$ when the switch $SW_{12}$ is closed, as well as outputting the thus held voltage value. Also, the output terminal of the holding circuit $H_{A,m,2}$ is connected to the second input terminal of the subtracting circuit $S_A$ via a switch $SW_{22}$.

The opening and closing of the switch $SW_{11}$ is controlled by a $Hold_{A,1}$ signal. The opening and closing of the switch $SW_{12}$ is controlled by a $Hold_{A,2}$ signal. Further, the opening and closing of the switches $SW_{21}$ and $SW_{22}$ is controlled by a $Shift_{A,m}$ signal. These signals will be outputted from the control section 41.

The subtracting circuit $S_A$ has the first and second input terminals. On the basis of a voltage value $V_{A,m,1}$ inputted to the first input terminal and a voltage value $V_{A,m,2}$ inputted to the second input terminal, the subtracting circuit $S_A$ outputs a voltage value $V_{A,m}$ ($=V_{A,m,1}-V_{A,m,2}$) in accordance with the difference between the voltage values. The first and second input terminals can be connected to a ground potential through switches, the opening and closing of which is to be controlled by a $Reset_A$ signal to be outputted from the control section 41.

Figure 5:
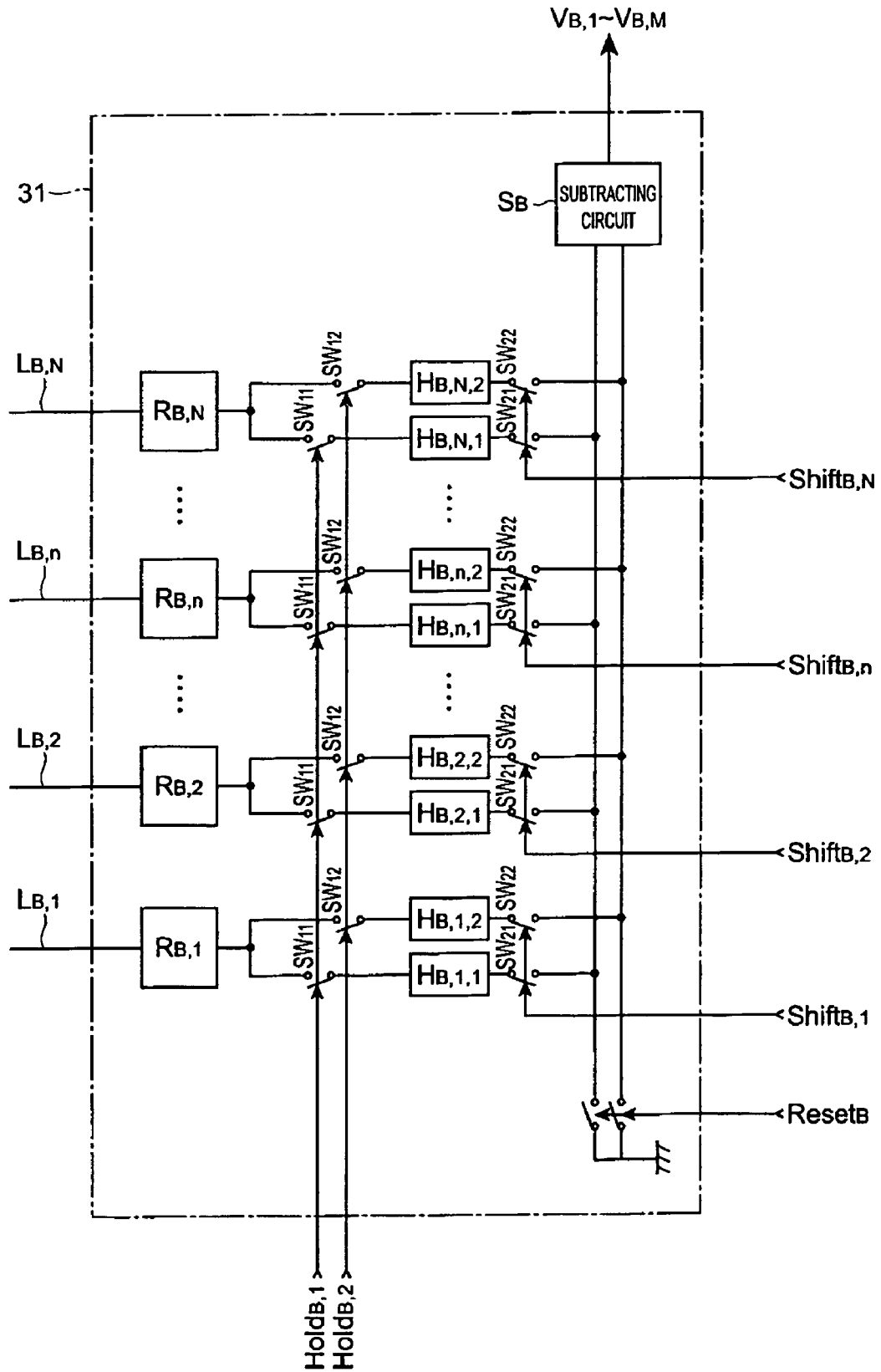
FIG. 5 is a view showing the configuration of a second signal processing section in the photo-detecting apparatus according to the first embodiment.

FIG. 5 is a view showing the configuration of the second signal processing section 31 in the photo-detecting apparatus 1 according to the first embodiment. The second signal processing section 31 includes N readout circuits $R_{B,1}$ to $R_{B,N}$, N holding circuits $H_{B,1,1}$ to $H_{B,N,1}$, N holding circuits $H_{B,1,2}$ to $H_{B,N,2}$, and a subtracting circuit $S_B$. The readout circuit $R_{B,n}$ is connected to the line $L_{B,n}$ and holds an electric charge to be transferred from the photodiode $PD_{B,m,n}$ through the line $L_{B,n}$ as well as outputting a voltage value in accordance with the thus held charge quantity.

The input terminal of the holding circuit $H_{B,n,1}$ is connected to the output terminal of the readout circuit $R_{B,n}$ via a switch $SW_{11}$ and holds a voltage value to be outputted from the readout circuit $R_{B,n}$ when the switch $SW_{11}$ is closed, as well as outputting the thus held voltage value. Also, the output terminal of the holding circuit $H_{B,n,1}$ is connected to the first input terminal of the subtracting circuit $S_B$ via a switch $SW_{21}$.

The input terminal of the holding circuit $H_{B,n,2}$ is connected to the output terminal of the readout circuit $R_{B,n}$ via a switch $SW_{12}$ and holds a voltage value to be outputted from the readout circuit $R_{B,n}$ when the switch $SW_{12}$ is closed, as well as outputting the thus held voltage value. Also, the output terminal of the holding circuit $H_{B,n,2}$ is connected to the second input terminal of the subtracting circuit $S_B$ via a switch $SW_{22}$.

The opening and closing of the switch $SW_{11}$ is controlled by a $Hold_{B,1}$ signal. The opening and closing of the switch $SW_{12}$ is controlled by a $Hold_{B,2}$ signal. Further, the opening and closing of the switches $SW_{21}$ and $SW_{22}$ is controlled by a $Shift_{B,n}$ signal. These signals will be outputted from the control section 41.

The subtracting circuit $S_B$ has the first and second input terminals. On the basis of a voltage value $V_{B,n,1}$ inputted to the first input terminal and a voltage value $V_{B,n,2}$ inputted to the second input terminal, the subtracting circuit $S_B$ outputs a voltage value $V_{B,n}$ ($=V_{B,n,1}-V_{B,n,2}$) in accordance with the difference between the voltage values. The first and second input terminals can be connected to a ground potential through switches, the opening and closing of which is to be controlled by a $Reset_B$ signal to be outputted from the control section 41.

Figure 6:
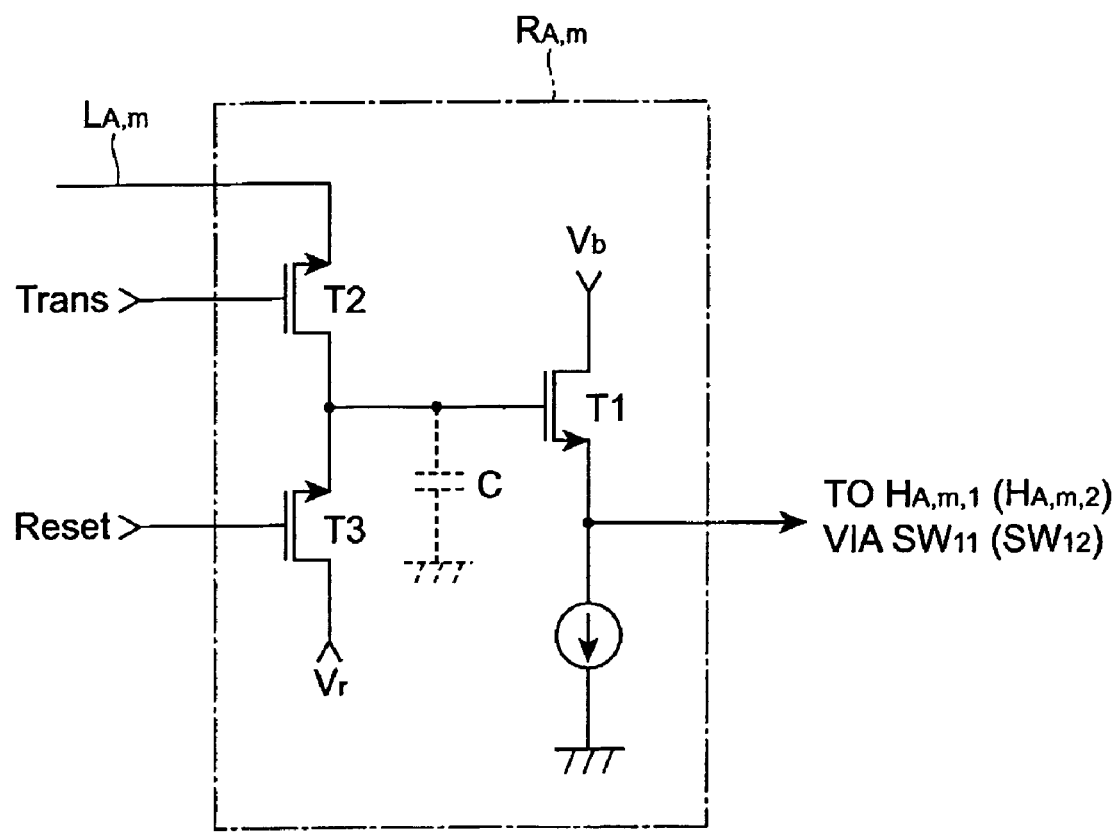
FIG. 6 is a circuit diagram of a readout circuit.

FIG. 6 is a circuit diagram of the readout circuit $R_{A,m}$. The readout circuits $R_{A,m}$ and $R_{B,n}$ have the same circuit configuration. Each readout circuit $R_{A,m}$ comprises a capacitive section C for holding an electric charge, a transistor T1 and a constant current source as amplifying means for outputting a voltage value in accordance with the charge quantity held in the capacitive section C, a transistor T2 as transfer means for transferring an electric charge from the photodiode $PD_{A,m,n}$ to the capacitive section C through the line $L_{A,m}$, and a transistor T3 as discharge means for discharging an electric charge in the capacitive section C.

The drain terminal of the transistor T1 has a bias potential, and the source terminal of the transistor T1 is connected with the constant current source and is further connected to the holding circuits $H_{A,m,1}$ and $H_{A,m,2}$ via the respective switches $SW_{11}$ and $SW_{12}$. The capacitive section is provided between the gate terminal of the transistor T1 and the ground potential. The source terminal of the transistor T2 is connected to the line $L_{A,m}$, while the drain terminal of the transistor T2 is connected to the gate terminal of the transistor T1, a Trans signal being inputted to the gate terminal of the transistor T2. The source terminal of the transistor T3 is connected to the gate terminal of the transistor T1, while the drain terminal of the transistor T3 has a reset potential, a Reset signal being inputted to the gate terminal of the transistor T3. The Reset signal and the Trans signal is outputted from the control section 41.

The transistor T2 transfers an electric charge from the photodiode $PD_{A,m,n}$ to the capacitive section C through the line $L_{A,m}$ when the Trans signal entering the gate terminal thereof is at a high level. The transistor T3 discharges an electric charge in the capacitive section C when the Reset signal entering the gate terminal thereof is at a high level. It is noted that the capacitive section C may be made intentionally as a capacitive element, or may be gate capacitance of the transistor T1, drain capacitance of the transistor T2, source capacitance of the transistor T3, or wiring capacitance, or further may be any combination thereof.

Figure 7:
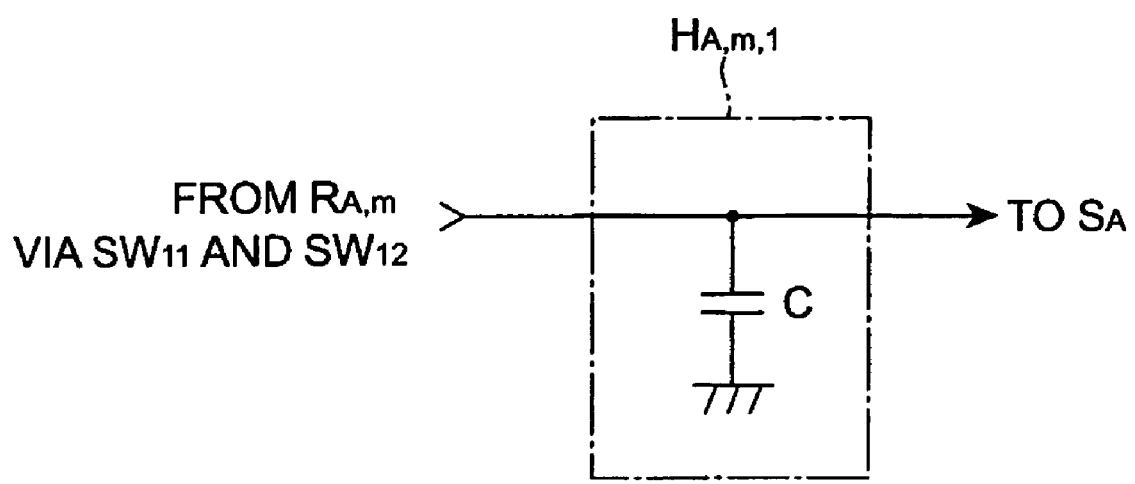
FIG. 7 is a circuit diagram of a holding circuit.

FIG. 7 is a circuit diagram of the holding circuit $H_{A,m,1}$. The holding circuits $H_{A,m,1}$, $H_{A,m,2}$, $H_{B,n,1}$, and $H_{B,n,2}$ have the same circuit configuration. The holding circuit $H_{A,m,1}$ has a capacitive element C provided between the input and output terminals and the ground potential. Each holding circuit $H_{A,m,1}$ holds an electric charge in the capacitive element C in accordance with a voltage value input from the readout circuit $R_{A,m}$ as well as outputting a voltage value according to the charge quantity to the subtracting circuit $S_A$.

Figure 8:
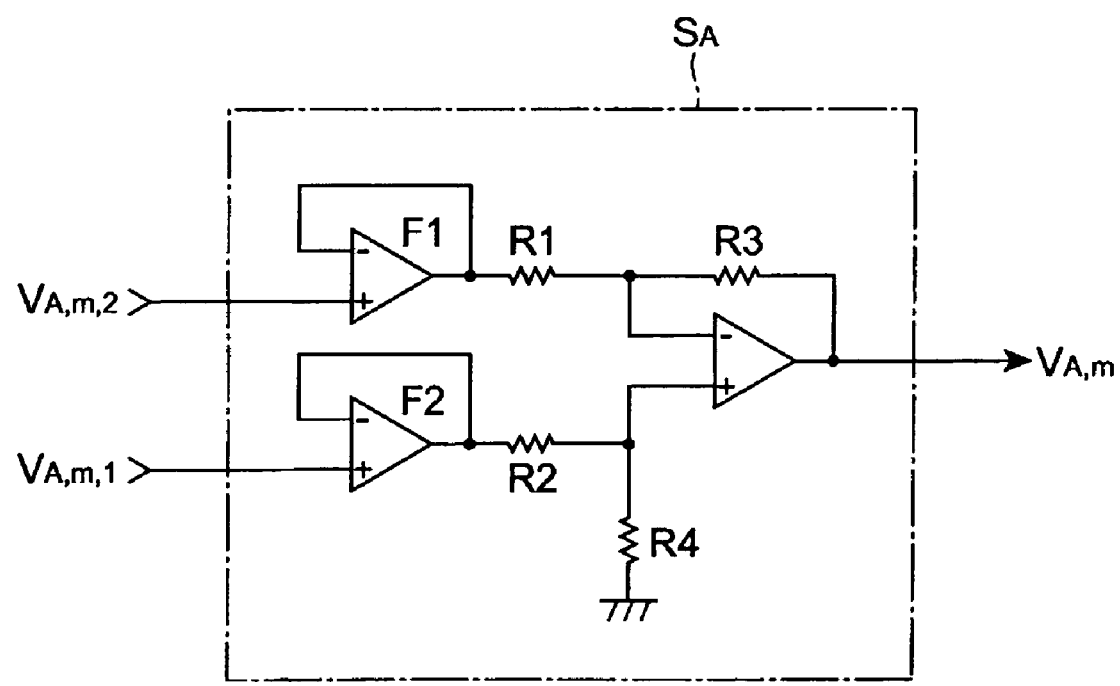
FIG. 8 is a circuit diagram of a subtracting circuit.

FIG. 8 is a circuit diagram of the subtracting circuit $S_A$. The subtracting circuits $S_A$ and $S_B$ have the same circuit configuration. The subtracting circuit $S_A$ has two voltage follower circuits F1 and F2, four resistors R1 to R4, and an amplifier.

The two voltage follower circuits F1 and F2 have the same configuration in which the inverting input terminal and the output terminal of an amplifier are connected directly to each other to have a high input impedance and a low output impedance, being ideally an amplifier circuit with an amplification factor of 1. The one voltage follower circuit F1 is adapted to receive a voltage value $V_{A,m,2}$ to be sequentially outputted from the M holding circuits $H_{A,1,2}$ to $H_{A,M,2}$ through the non-inverting input terminal. The other voltage follower circuit F2 receives a voltage value $V_{A,m,1}$ to be sequentially outputted from the M holding circuits $H_{A,1,1}$ to $H_{A,m,1}$ ml through the non-inverting input terminal.

The inverting input terminal of the amplifier is connected to the output terminal of the voltage follower circuit F1 via the resistor R1 as well as to the output terminal thereof via the resistor R3. The non-inverting input terminal of the amplifier is connected to the output terminal of the voltage follower circuit F2 via the resistor R2 as well as to the ground potential via the resistor R4. Assuming that the amplification factor of the voltage follower circuits F1 and F2 is 1 and that the four resistors R1 to R4 have the same resistance, the voltage value $V_{A,m}$ to be outputted from the output terminal of the subtracting circuit $S_A$ can be represented by the formula: $V_{A,m}=V_{A,m,1}-V_{A,m,2}$.

Figure 9:
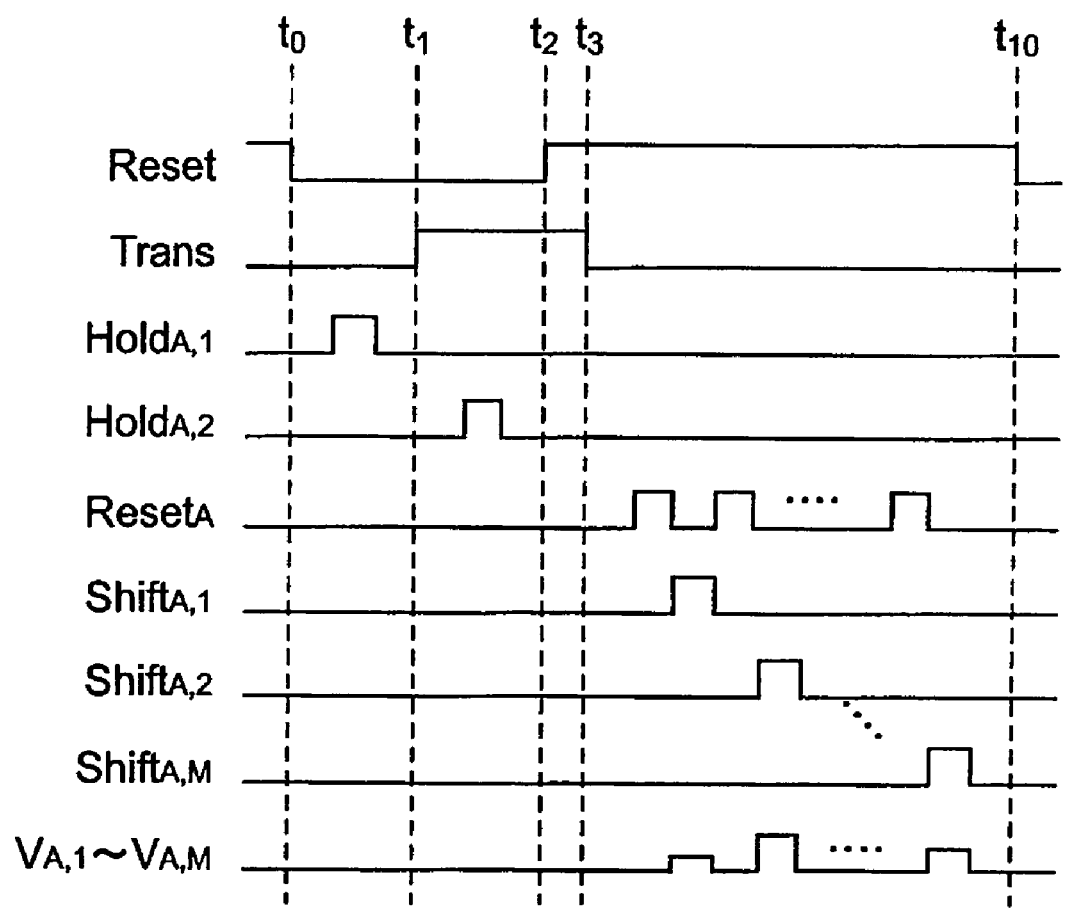
FIG. 9 is a timing diagram for illustrating the operation of the first signal processing section in the photo-detecting apparatus according to the first embodiment.

Next, the operation of the photo-detecting apparatus 1 according to the first embodiment will be explained. Although the operation of the first signal processing section 21 will here be explained, the same applies to the operation of the second signal processing section 31. FIG. 9 is a timing diagram for illustrating the operation of the first signal processing section 21 in the photo-detecting apparatus 1 according to the first embodiment.

It is noted that FIG. 9 shows the waveforms of a Reset signal to be inputted to the gate terminal of the transistor T3 in the readout circuit $R_{A,m}$, a Trans signal to be inputted to the gate terminal of the transistor T2 in the readout circuit $R_{A,m}$, a $Hold_{A,1}$ signal for controlling the opening and closing of the switch $SW_{11}$ provided between the readout circuit $R_{A,m}$ and the holding circuit $H_{A,m,1}$, a $Hold_{A,2}$ signal for controlling the opening and closing of the switch $SW_{12}$ provided between the readout circuit $R_{A,m}$ and the holding circuit $H_{A,m,2}$, a $Reset_A$ signal for controlling the opening and closing of the switches provided between the first and second input terminals of the subtracting circuit $S_A$ and the ground potential, a $Shift_{A,1}$ signal for controlling the opening and closing of the switches $SW_{21}$ and $SW_{22}$ provided between the holding circuits $H_{A,1,1}$ and $H_{A,1,2}$ and the subtracting circuit $S_A$, a $Shift_{A,2}$ signal for controlling the opening and closing of the switches $SW_{21}$ and $SW_{22}$ provided between the holding circuits $H_{A,2,1}$ and $H_{A,2,2}$ and the subtracting circuit $S_A$, a $Shift_{A,M}$ signal for controlling the opening and closing of the switches $SW_{21}$ and $SW_{22}$ provided between the holding circuits $H_{A,M,1}$ and $H_{A,M,2}$ and the subtracting circuit $S_A$, and a voltage value $V_{A,m}$ to be outputted from the subtracting circuit $S_A$ in this order from above.

Before the time $t_0$, the Reset signal is at a high level, while the Trans signal is at a low level, the $Hold_{A,1}$ signal is at a low level, the $Hold_{A,2}$ signal is at a low level, the $Reset_A$ signal is at a low level, and each $Shift_{A,m}$ signal is at a low level. The Reset signal shifts to a low level at the time $t_0$ and returns to a high level at the time $t_2$, which follows the time $t_0$. The Trans signal shifts to a high level at the time $t_1$, which follows the time $t_0$ but precedes the time $t_2$, and returns to a low level at the time $t_3$, which follows the time $t_2$.

Since the Reset signal is at a high level before the time $t_0$ and the Trans signal is at a low level from the time $t_0$ through $t_1$, the electric charge in the capacitive section C of the readout circuit $R_{A,m}$ is discharged to be in an initial state during the time period, whereby the voltage value (dark signal component) in this initial state is to be outputted from the readout circuit $R_{A,m}$. The $Hold_{A,1}$ signal is at a high level during a certain time period between the time $t_0$ and $t_1$ to close the switch $SW_{11}$, whereby the output voltage value (dark signal component) $V_{A,m,1}$ of the readout circuit $R_{A,m}$ during the time period is to be held by the holding circuit $H_{A,m,1}$.

Since the Reset signal is at a low level while the Trans signal is at a high level from the time $t_1$ through $t_2$, an electric charge generated in a photodiode is to be transferred and held in the capacitive section C of the readout circuit $R_{A,m}$ through the line $L_{A,m}$ to output a voltage value (light signal component) in accordance with the charge quantity from the readout circuit $R_{A,m}$. The $Hold_{A,2}$ signal is at a high level during a certain time period between the time $t_1$ and $t_2$ to close the switch $SW_{12}$, whereby the output voltage value (light signal component) $V_{A,m,2}$ of the readout circuit $R_{A,m}$ during the time period is to be held by the holding circuit $H_{A,m,2}$.

Since the Reset signal is at a high level and the Trans signal is also at a high level from the time $t_2$ through $t_3$, the electric charge in the capacitive section C of the readout circuit $R_{A,m}$ is discharged to be in an initial state during the time period. Since the Trans signal is also at a high level, if there remains an electric charge after transfer in the photodiodes $PD_{A,m,1}$ to $PD_{A,m,N}$, the electric charge is also to be discharged to be in an initial state. Charge accumulation in the photodiodes $PD_{A,m,1}$ to $PD_{A,m,N}$ will be started at the time $t_3$.

Since the Reset signal is at a high level while the Trans signal is at a low level and the $Hold_{A,1}$ and $Hold_{A,2}$ signals are still at a low level from the time $t_3$ through $t_{10}$, the voltage values held in the respective holding circuits $H_{A,m,1}$ and $H_{A,m,2}$ will remain held without change. During this time period, the $Reset_A$ signal is at a high level for a certain time period repeatedly M times. Then, during the time period in which the $Reset_A$ signal is at a low level after the m-th high level, the $Shift_{A,m}$ signal is at a high level for a certain time period.

The $Shift_{A,m}$ signal being thus at a high level for a certain time period causes the switches $SW_{21}$ and $SW_{22}$ provided between the holding circuits $H_{A,m,1}$ and $H_{A,m,2}$ and the subtracting circuit $S_A$ to be closed, whereby the voltage value $V_{A,m,1}$ held in the holding circuit $H_{A,m,1}$ is to be inputted to the subtracting circuit $S_A$ and the voltage value $V_{A,m,2}$ held in the holding circuit $H_{A,m,2}$ is to be inputted to the subtracting circuit $S_A$, which results in that a voltage value $V_{A,m}$ ($=V_{A,m,1}-V_{A,m,2}$) is outputted from the output terminal of the subtracting circuit $S_A$. Thus, the voltage values $V_{A,1}$ to $V_{A,M}$ are sequentially outputted from the first signal processing section 21 to obtain the intensity distribution of incident light in the column direction.

It is noted that the second signal processing section 31 may be operated during the same time period as above where the first signal processing section 21 is operated, or may be operated during a time period different from above. It is however preferable that the first and second signal processing sections 21 and 31 share the Reset signal as well as the Trans signal, and that the $Hold_{A,1}$ and $Hold_{B,1}$ signals correspond to each other, while the $Hold_{A,2}$ and $Hold_{B,2}$ signals correspond to each other. This causes the M readout circuits $R_{A,1}$ to $R_{A,M}$ and the N readout circuits $R_{B,1}$ to $R_{B,N}$ to be operated at the same timing, the M holding circuits $H_{A,1,1}$ to $H_{A,M,1}$ and the N holding circuits $H_{B,1,1}$ to $H_{B,N,1}$ to be operated at the same timing, and the M holding circuits $H_{A,1,2}$ to $H_{A,M,2}$ and the N holding circuits $H_{B,1,2}$ to $H_{B,N,2}$ to be operated at the same timing. It is therefore possible to measure the intensity distribution of incident light at the same timing in both the column and row directions that are at right angles to each other in the two-dimensional array composed of the plurality of pixels.

As described above, in the photo-detecting apparatus 1 according to the first embodiment, the M readout circuits $R_{A,m}$ included in the first signal processing section 21 can be operated at the same timing, the M holding circuits $H_{A,m,1}$ can be operated at the same timing, and the M holding circuits $H_{A,m,2}$ can be operated at the same timing. That is, an electric charge to be outputted from the line $L_{A,m}$ to which the N photodiodes $PD_{A,m,1}$ to $PD_{A,m,N}$ included in the group of pixels constituting the m-th row are connected can be read out at the same timing. The same applies to the second signal processing section 31. Accordingly, the photo-detecting apparatus 1 according to the first embodiment can obtain the intensity distribution of incident light at the same timing even when the intensity distribution of incident light may change with time.

Second Embodiment

Figure 10:
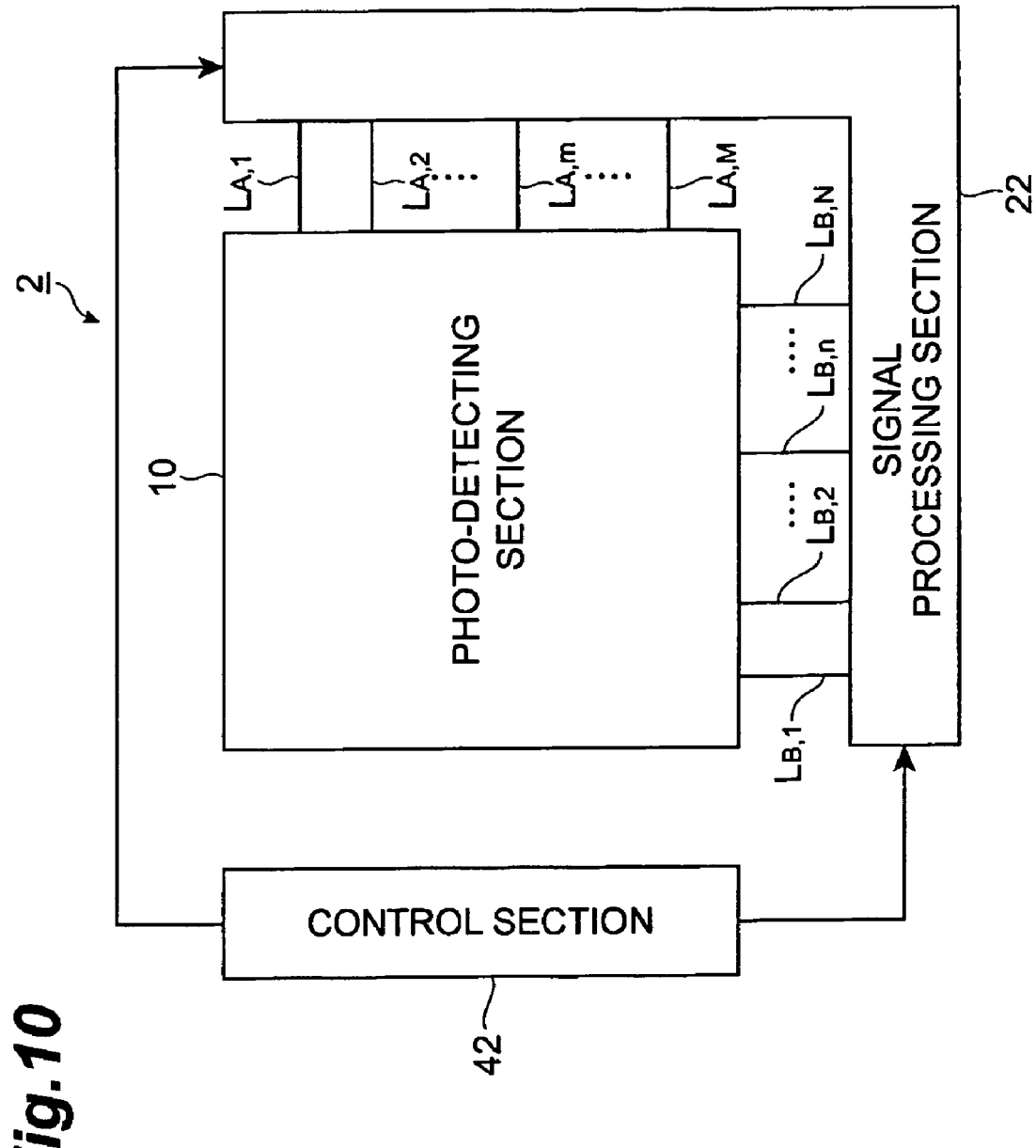
FIG. 10 is a view showing the schematic configuration of a second embodiment of a photo-detecting apparatus according to the present invention.

Next, a second embodiment of a photo-detecting apparatus according to the present invention will be explained. FIG. 10 is a view showing the schematic configuration of the photo-detecting apparatus 2 according to the second embodiment. As shown in FIG. 10, the photo-detecting apparatus 2 comprises a photo-detecting section 10, a signal processing section 22, and a control section 42. The photo-detecting section 10 has the same structure as in the first embodiment. The signal processing section 22 is electrically connected to the photo-detecting section 10 through M lines $L_{A,1}$ to $L_{A,M}$ and holds an electric charge to be transferred from photodiodes in the photo-detecting section 10 through each line $L_{A,m}$ as well as outputting a voltage value $V_{A,m}$ in accordance with the thus held charge quantity, and is electrically connected to the photo-detecting section 10 through N lines $L_{B,1}$ to $L_{B,N}$ and holds an electric charge to be transferred from photodiodes in the photo-detecting section 10 through each line $L_{B,n}$ as well as outputting a voltage value $V_{B,n}$ in accordance with the thus held charge quantity. The control section 42 controls the operation of the signal processing section 22.

Figure 11:
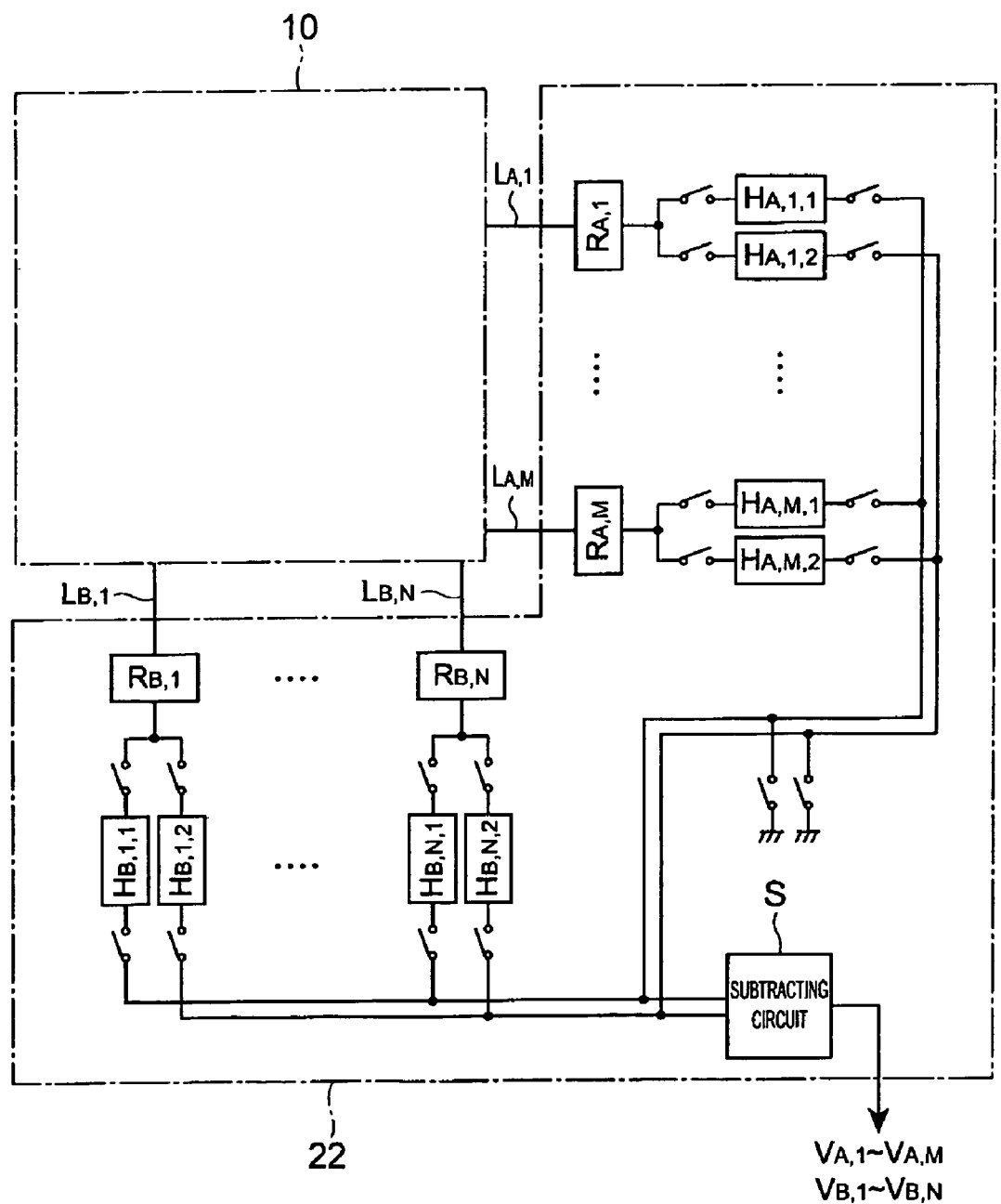
FIG. 11 is a view showing the configuration of a signal processing section in the photo-detecting apparatus according to the second embodiment.

FIG. 11 is a view showing the configuration of the signal processing section 22 in the photo-detecting apparatus 2 according to the second embodiment. In the photo-detecting apparatus 2, the signal processing section 22 includes M readout circuits $R_{A,1}$ to $R_{A,M}$, M holding circuits $H_{A,1,1}$ to $H_{A,M,1}$, M holding circuits $H_{A,1,2}$ to $H_{A,M,2}$, N readout circuits $R_{B,1}$ to $R_{B,N}$, N holding circuits $H_{B,1,1}$ to $H_{B,N,1}$, N holding circuits $H_{B,1,2}$ to $H_{B,N,2}$, and a subtracting circuit S. The signal processing section 22 has approximately the same configuration as that including both the first and second signal processing sections 21 and 31 of the photo-detecting apparatus 1 according to the first embodiment, with a difference in having one subtracting circuit S instead of the subtracting circuits $S_A$ and $S_B$. It is noted that in FIG. 11, signal lines for controlling the opening and closing of switches are omitted.

In the signal processing section 22, one of the holding circuit $H_{A,m,1}$ and the holding circuit $H_{A,m,2}$ holds a voltage value to be outputted from the readout circuit $R_{A,m}$, and one of the holding circuit $H_{B,n,1}$ and the holding circuit $H_{B,n,2}$ holds a voltage value to be outputted from the readout circuit $R_{B,n}$. Then, the subtracting circuit S receives a voltage value $V_{A,m,1}$ to be outputted from the holding circuit $H_{A,m,1}$ and a voltage value $V_{A,m,2}$ to be outputted from the holding circuit $H_{A,m,2}$ to output a voltage value $V_{A,m}$ representing the difference between the voltage values ($V_{A,m,1} - V_{A,m,2}$) as well as receiving a voltage value $V_{B,n,1}$ to be outputted from the holding circuit $H_{B,n,1}$ and a voltage value $V_{B,n,2}$ to be outputted from the holding circuit $H_{B,n,2}$ to output a voltage value $V_{B,n}$ representing the difference between the voltage values ($V_{B,n,1} - V_{B,n,2}$).

The operation of the photo-detecting apparatus 2 according to the second embodiment is approximately the same as that of the photo-detecting apparatus 1 according to the first embodiment, and it is therefore possible to measure the intensity distribution of incident light at the same timing in both the column and row directions that are at right angles to each other in the two-dimensional array constituted by the plurality of pixels. However, in the photo-detecting apparatus 2, voltage values $V_{A,1}$ to $V_{A,M}$ and $V_{B,1}$ to $V_{B,N}$ are to be sequentially outputted from the one subtracting circuit S.

Third Embodiment

Figure 12:
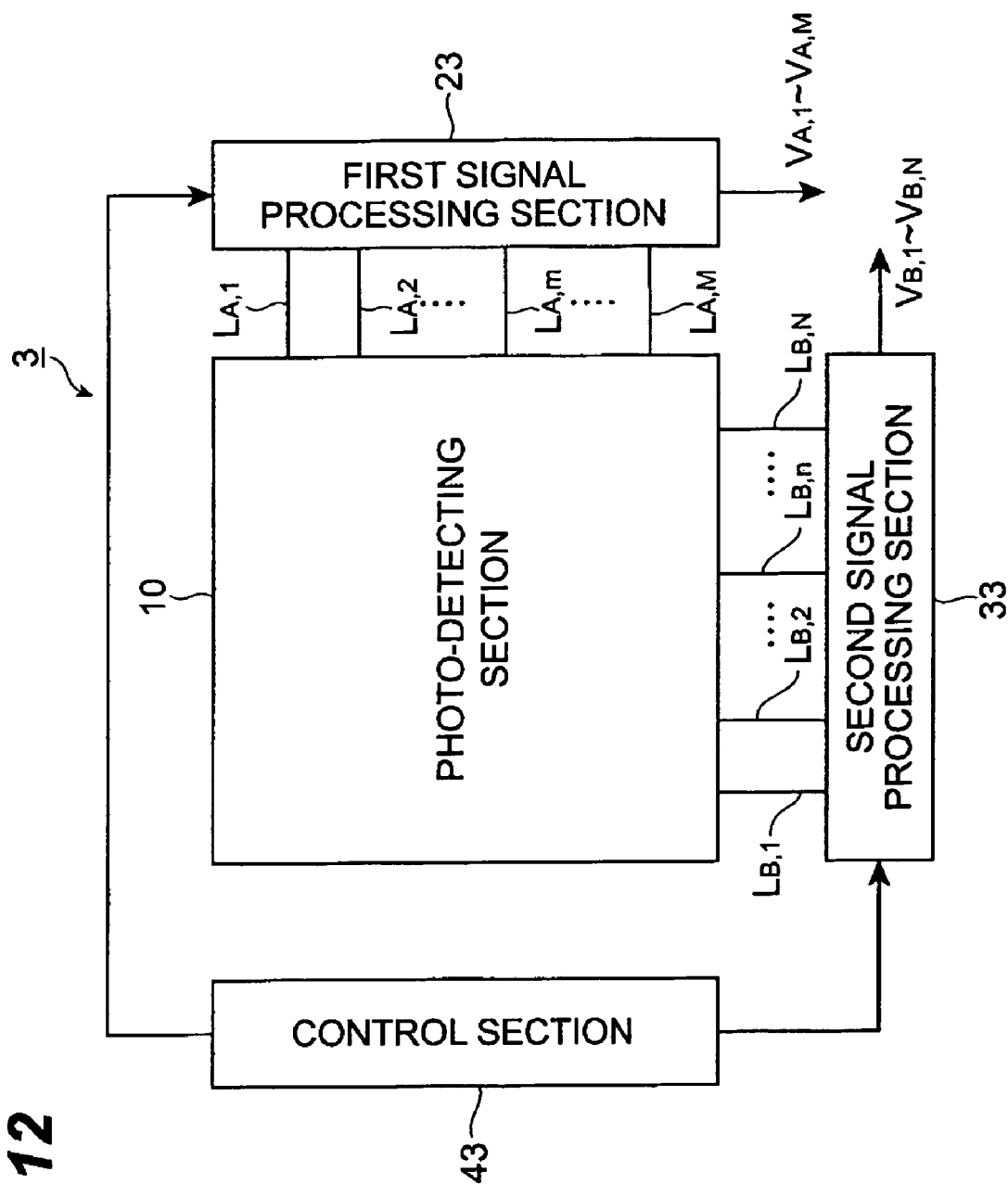
FIG. 12 is a view showing the schematic configuration of a third embodiment of a photo-detecting apparatus according to the present invention.

Next, a third embodiment of a photo-detecting apparatus according to the present invention will be explained. FIG. 12 is a view showing the schematic configuration of the photo-detecting apparatus 3 according to the third embodiment. As shown in FIG. 12, the photo-detecting apparatus 3 comprises a photo-detecting section 10, a first signal processing section 23, a second signal processing section 33, and a control section 43. The photo-detecting section 10 has the same structure as in the first embodiment. The first signal processing section 23 is electrically connected to the photo-detecting section 10 through M lines $L_{A,1}$ to $L_{A,M}$ and holds an electric charge to be transferred from photodiodes in the photo-detecting section 10 through each line $L_{A,m}$ as well as outputting a voltage value $V_{A,m}$ in accordance with the thus held charge quantity. The second signal processing section 33 is electrically connected to the photo-detecting section 10 through N lines $L_{B,1}$ to $L_{B,N}$ and holds an electric charge to be transferred from photodiodes in the photo-detecting section 10 through each line $L_{B,n}$ as well as outputting a voltage value $V_{B,n}$ in accordance with the thus held charge quantity. The control section 43 controls the operation of the first and second signal processing sections 23 and 33.

Figure 13:
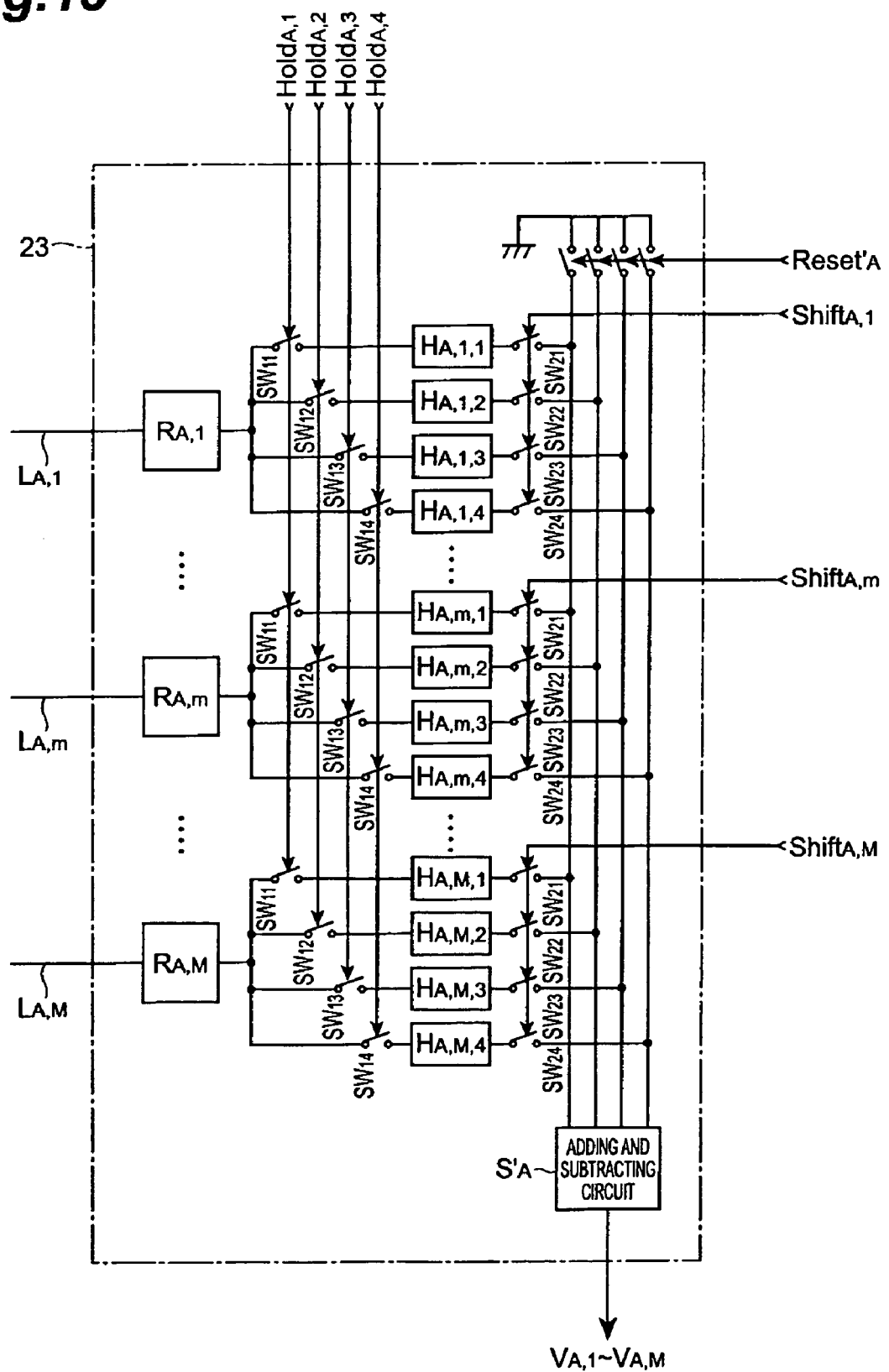
FIG. 13 is a view showing the configuration of a first signal processing section in the photo-detecting apparatus according to the third embodiment.

FIG. 13 is a view showing the configuration of the first signal processing section 23 in the photodetecting apparatus 3 according to the third embodiment. The first signal processing section 23 includes M readout circuits $R_{A,1}$ to $R_{A,M}$, M holding circuits $H_{A,1,1}$ to $H_{A,M,1}$, M holding circuits $H_{A,1,2}$ to $H_{A,M,2}$, M holding circuits $H_{A,1,3}$ to $H_{A,M,3}$, M holding circuits $H_{A,1,4}$ to $H_{A,M,4}$, and an adding and subtracting circuit $S'_A$. The readout circuit $R_{A,m}$ is connected to the line $L_{A,m}$ and holds an electric charge to be transferred from photodiodes in the photo-detecting section 10 through the line $L_{A,m}$ as well as outputting a voltage value in accordance with the thus held charge quantity.

The input terminal of the holding circuit $H_{A,m,1}$ is connected to the output terminal of the readout circuit $R_{A,m}$ via a switch $SW_{11}$ and holds a voltage value to be outputted from the readout circuit $R_{A,m}$ when the switch $SW_{11}$ is closed, as well as outputting the thus held voltage value. Also, the output terminal of the holding circuit $H_{A,m,1}$ is connected to the first input terminal of the adding and subtracting circuit $S'_A$ via a switch $SW_{21}$.

The input terminal of the holding circuit $H_{A,m,2}$ is connected to the output terminal of the readout circuit $R_{A,m}$ via a switch $SW_{12}$ and holds a voltage value to be outputted from the readout circuit $R_{A,m}$ when the switch $SW_{12}$ is closed, as well as outputting the thus held voltage value. Also, the output terminal of the holding circuit $H_{A,m,2}$ is connected to the second input terminal of the adding and subtracting circuit $S'_A$ via a switch $SW_{22}$.

The input terminal of the holding circuit $H_{A,m,3}$ is connected to the output terminal of the readout circuit $R_{A,m}$ via a switch $SW_{13}$ and holds a voltage value to be outputted from the readout circuit $R_{A,m}$ when the switch $SW_{13}$ is closed, as well as outputting the thus held voltage value. Also, the output terminal of the holding circuit $H_{A,m,3}$ is connected to the third input terminal of the adding and subtracting circuit $S'_A$ via a switch $SW_{23}$.

The input terminal of the holding circuit $H_{A,m,4}$ is connected to the output terminal of the readout circuit $R_{A,m}$ via a switch $SW_{14}$ and holds a voltage value to be outputted from the readout circuit $R_{A,m}$ when the switch $SW_{14}$ is closed, as well as outputting the thus held voltage value. Also, the output terminal of the holding circuit $H_{A,m,4}$ is connected to the fourth input terminal of the adding and subtracting circuit $S'_A$ via a switch $SW_{24}$.

The opening and closing of the switch $SW_{11}$ is controlled by a $Hold_{A,1}$ signal. The opening and closing of the switch $SW_{12}$ is controlled by a $Hold_{A,2}$ signal. The opening and closing of the switch $SW_{13}$ is controlled by a $Hold_{A,3}$ signal. The opening and closing of the switch $SW_{14}$ is controlled by a $Hold_{A,4}$ signal. Further, the opening and closing of the switches $SW_{21}$ to $SW_{24}$ is controlled by a $Shift_{A,m}$ signal. These signals will be outputted from the control section 43.

The adding and subtracting circuit $S'_A$ has the first, second, third, and fourth input terminals. Based on a voltage value $V_{A,m,1}$ inputted to the first input terminal, a voltage value $V_{A,m,2}$ inputted to the second input terminal, a voltage value $V_{A,m,3}$ inputted to the third input terminal, and a voltage value $V_{A,m,4}$ inputted to the fourth input terminal, the adding and subtracting circuit $S'_A$ outputs a voltage value $V_{A,m}$ ($=(V_{A,m,3}-V_{A,m,4})-(V_{A,m,1}-V_{A,m,2})$) representing the result of adding and subtracting the voltage values. The first, second, third, and fourth input terminals can be connected to a ground potential through switches, the opening and closing of which is to be controlled by a $Reset'_A$ signal to be outputted from the control section 43.

Figure 14:
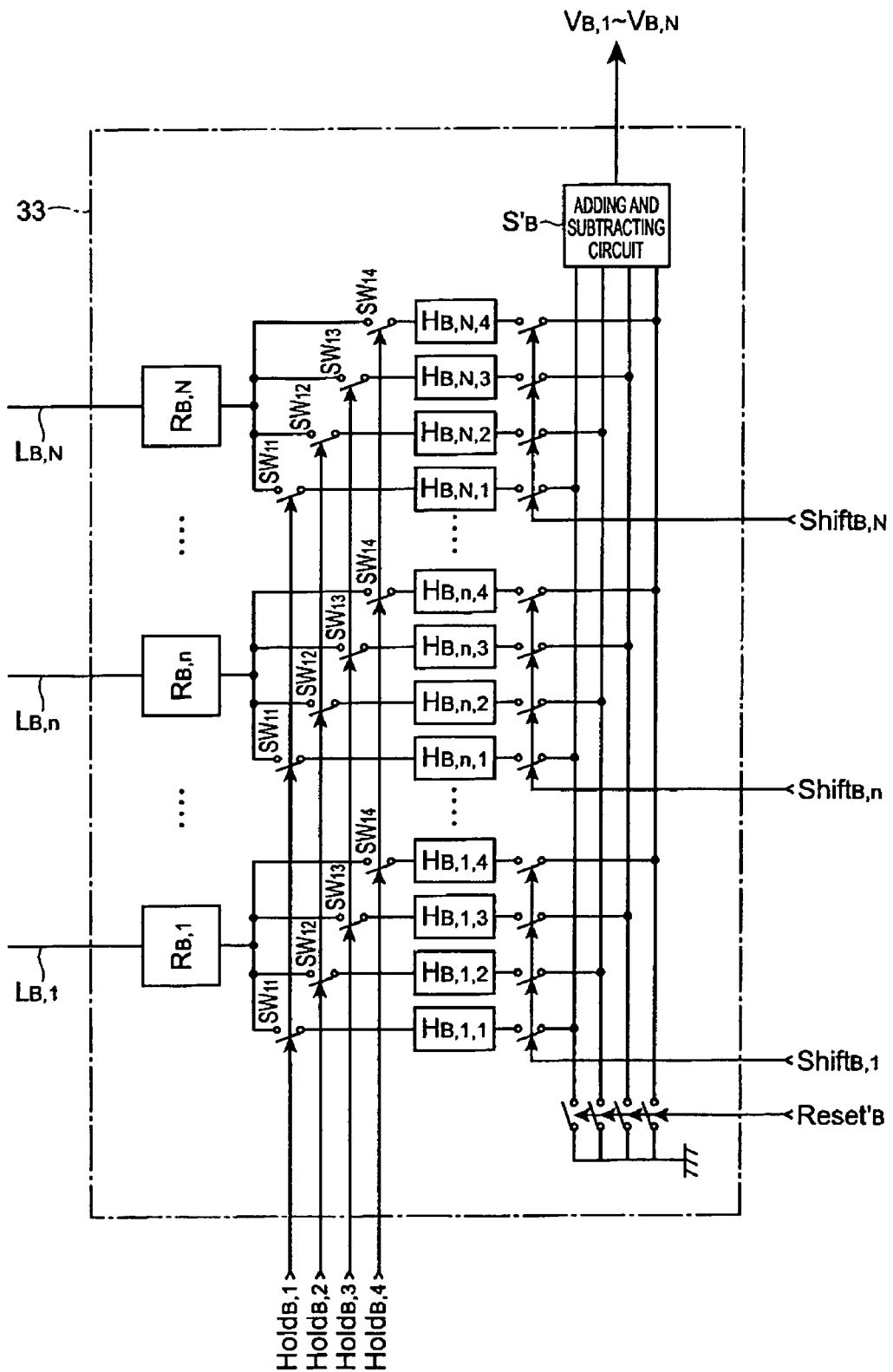
FIG. 14 is a view showing the configuration of a second signal processing section in the photo-detecting apparatus according to the third embodiment.

FIG. 14 is a view showing the configuration of the second signal processing section 33 in the photo-detecting apparatus 3 according to the third embodiment. The second signal processing section 33 includes N readout circuits $R_{B,1}$ to $R_{B,N}$, N holding circuits $H_{B,1,1}$ to $H_{B,N,1}$, N holding circuits $H_{B,1,2}$ to $H_{B,N,2}$, N holding circuits $H_{B,1,3}$ to $H_{B,N,3}$, N holding circuits $H_{B,1,4}$ to $H_{B,N,4}$, and an adding and subtracting circuit $S'_B$. The readout circuit $R_{B,n}$ is connected to the line $L_{B,n}$ and holds an electric charge to be transferred from photodiodes in the photo-detecting section 10 through the line $L_{B,n}$ as well as outputting a voltage value according to the thus held charge quantity.

The input terminal of the holding circuit $H_{B,n,1}$ is connected to the output terminal of the readout circuit $R_{B,n}$ via a switch $SW_{11}$ and holds a voltage value to be outputted from the readout circuit $R_{B,n}$ when the switch $SW_{11}$ is closed, as well as outputting the thus held voltage value. Also, the output terminal of the holding circuit $H_{B,n,1}$ is connected to the first input terminal of the adding and subtracting circuit $S'_B$ via a switch $SW_{21}$.

The input terminal of the holding circuit $H_{B,n,2}$ is connected to the output terminal of the readout circuit $R_{B,n}$ via a switch $SW_{12}$ and holds a voltage value to be outputted from the readout circuit $R_{B,n}$ when the switch $SW_{12}$ is closed, as well as outputting the thus held voltage value. Also, the output terminal of the holding circuit $H_{B,n,2}$ is connected to the second input terminal of the adding and subtracting circuit $S'_B$ via a switch $SW_{22}$.

The input terminal of the holding circuit $H_{B,n,3}$ is connected to the output terminal of the readout circuit $R_{B,n}$ via a switch $SW_{13}$ and holds a voltage value to be outputted from the readout circuit $R_{B,n}$ when the switch $SW_{13}$ is closed, as well as outputting the thus held voltage value. Also, the output terminal of the holding circuit $H_{B,n,3}$ is connected to the third input terminal of the adding and subtracting circuit $S'_B$ via a switch $SW_{23}$.

The input terminal of the holding circuit $H_{B,n,4}$ is connected to the output terminal of the readout circuit $R_{B,n}$ via a switch $SW_{14}$ and holds a voltage value to be outputted from the readout circuit $R_{B,n}$ when the switch $SW_{14}$ is closed, as well as outputting the thus held voltage value. Also, the output terminal of the holding circuit $H_{B,n,4}$ is connected to the fourth input terminal of the adding and subtracting circuit $S'_B$ via a switch $SW_{24}$.

The opening and closing of the switch $SW_{11}$ is controlled by a $Hold_{B,1}$ signal. The opening and closing of the switch $SW_{12}$ is controlled by a $Hold_{B,2}$ signal. The opening and closing of the switch $SW_{13}$ is controlled by a $Hold_{B,3}$ signal. The opening and closing of the switch $SW_{14}$ is controlled by a $Hold_{B,4}$ signal. Further, the opening and closing of the switches $SW_{21}$ to $SW_{24}$ is controlled by a $Shift_{B,n}$ signal. These signals will be outputted from the control section 43.

The adding and subtracting circuit $S'_B$ has the first, second, third, and fourth input terminals. On the basis of a voltage value $V_{B,n,1}$ inputted to the first input terminal, a voltage value $V_{B,n,2}$ inputted to the second input terminal, a voltage value $V_{B,n,3}$ inputted to the third input terminal, and a voltage value $V_{B,n,4}$ inputted to the fourth input terminal, the adding and subtracting circuit $S'_B$ outputs a voltage value $V_{B,n}$ $(=(V_{B,n,3}-V_{B,n,4})-(V_{B,n,1}-V_{B,n,2}))$ representing the result of adding and subtracting the voltage values. The first, second, third, and fourth input terminals can be connected to a ground potential through switches, the opening and closing of which is to be controlled by a $Reset'_B$ signal to be outputted from the control section 43.

Figure 15:
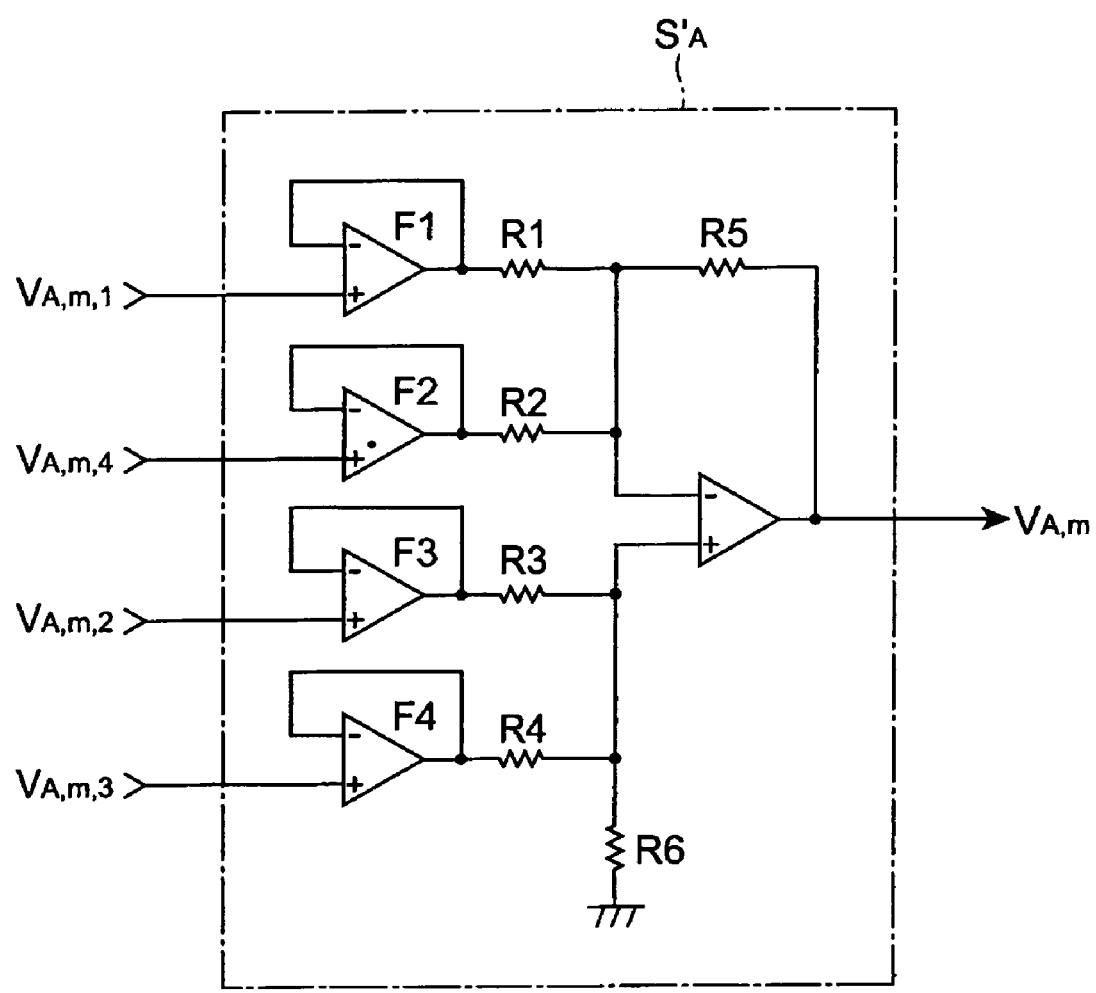
FIG. 15 is a circuit diagram of an adding and subtracting circuit.

FIG. 15 is a circuit diagram of the adding and subtracting circuit $S'_A$. The adding and subtracting circuits $S'_A$ and $S'_B$ have the same circuit configuration. The adding and subtracting circuit $S'_A$ has four voltage follower circuits F1 to F4, six resistors R1 to R6, and an amplifier.

The four voltage follower circuits F1 to F4 have the same configuration in which the inverting input terminal and the output terminal of an amplifier are connected directly to each other to have a high input impedance and a low output impedance, being ideally an amplifier circuit with an amplification factor of 1. The voltage follower circuit F1 receives a voltage value $V_{A,m,1}$ to be sequentially outputted from the M holding circuits $H_{A,1,1}$ to $H_{A,M,1}$ through the non-inverting input terminal. The voltage follower circuit F2 receives a voltage value $V_{A,m,4}$ to be sequentially outputted from the M holding circuits $H_{A,1,4}$ to $H_{A,M,4}$ through the non-inverting input terminal. The voltage follower circuit F3 receives a voltage value $V_{A,m,2}$ to be sequentially outputted from the M holding circuits $H_{A,1,2}$ to $H_{A,M,2}$ through the non-inverting input terminal. The voltage follower circuit F4 receives a voltage value $V_{A,m,3}$ to be sequentially outputted from the M holding circuits $H_{A,1,3}$ to $H_{A,M,3}$ through the non-inverting input terminal.

The inverting input terminal of the amplifier is connected to the output terminal of the voltage follower circuit F1 via the resistor R1 and to the output terminal of the voltage follower circuit F2 via the resistor R2 as well as to the output terminal thereof via the resistor R5. The non-inverting input terminal of the amplifier is connected to the output terminal of the voltage follower circuit F3 via the resistor R3 and to the output terminal of the voltage follower circuit F4 via the resistor R4 as well as to the ground potential via the resistor R6. Assuming that the amplification factor of the voltage follower circuits F1 to F4 is 1 and that the six resistors R1 to R6 have the same resistance, the voltage value $V_{A,m}$ to be outputted from the output terminal of the adding and subtracting circuit $S'_A$ can be represented by the formula: $V_{A,m}=(V_{A,m,3}-V_{A,m,4})-(V_{A,m,1}-V_{A,m,2})$.

Figure 16:
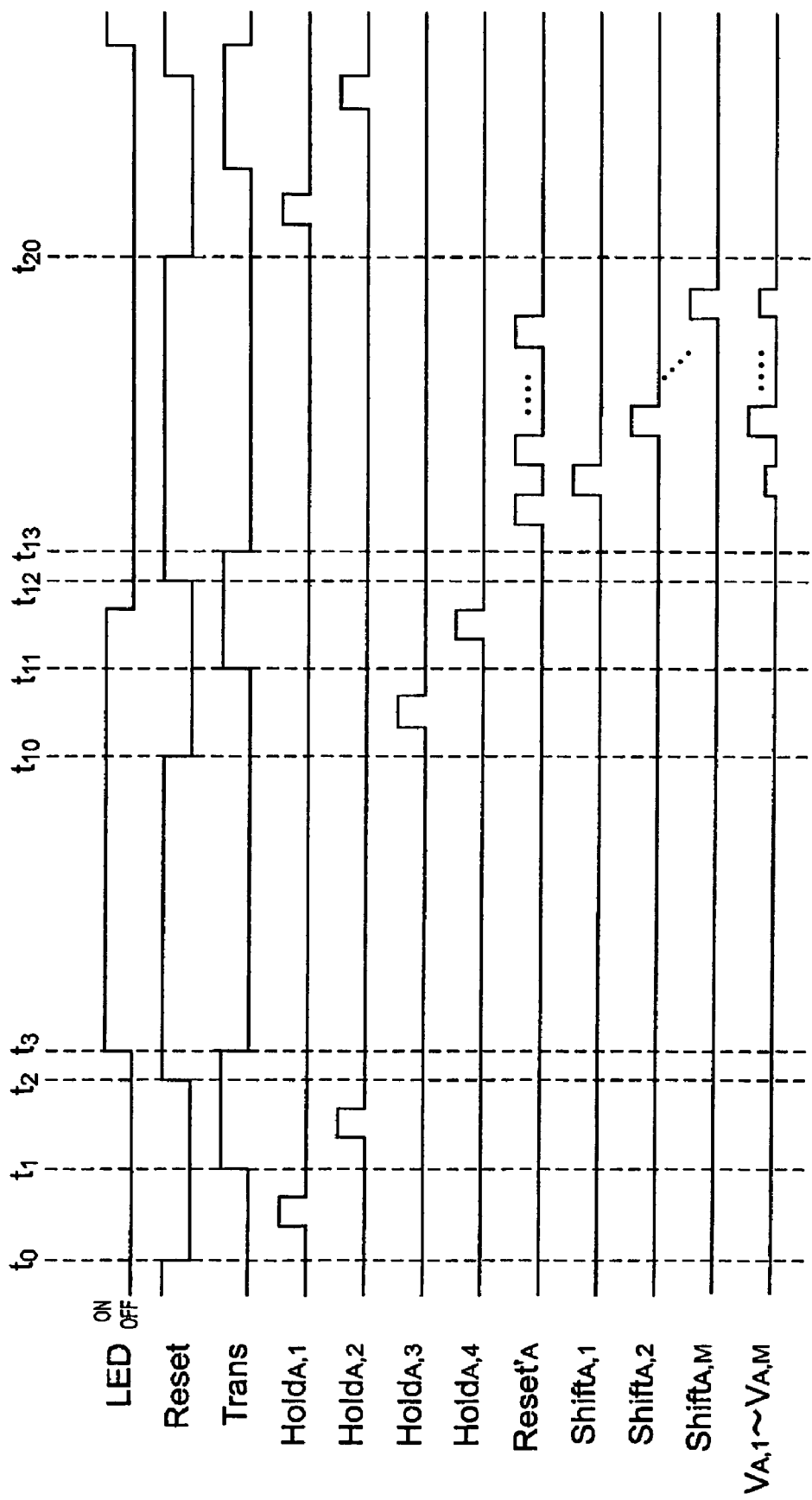
FIG. 16 is a timing diagram for illustrating the operation of the first signal processing section in the photo-detecting apparatus according to the third embodiment.

Next, an exemplary operation of the photo-detecting apparatus 3 according to the third embodiment will be explained. Although the operation of the first signal processing section 23 will here be explained, the same applies to the operation of the second signal processing section 33. FIG. 16 is a timing diagram for illustrating the operation of the first signal processing section 23 in the photo-detecting apparatus 3 according to the third embodiment. It is noted that here will be explained the case where the photo-detecting apparatus 3 is used together with a light-emitting diode (LED), for example, where light emitted from the LED enters the photo-detecting section 10 of the photo-detecting apparatus 3 directly or where light emitted from the LED and applied to a target object is imaged on the photo-detecting section 10 of the photo-detecting apparatus 3 via a lens system.

It is noted that FIG. 16 shows the emission timing of the LED on the top thereof, and the waveforms of a Reset signal to be inputted to the gate terminal of the transistor T3 in the readout circuit $R_{A,m}$, a Trans signal to be inputted to the gate terminal of the transistor T2 in the readout circuit $R_{A,m}$, a $Hold_{A,1}$ signal for controlling the opening and closing of the switch $SW_{11}$ provided between the readout circuit $R_{A,m}$ and the holding circuit $H_{A,m,1}$, a $Hold_{A,2}$ signal for controlling the opening and closing of the switch $SW_{12}$ provided between the readout circuit $R_{A,m}$ and the holding circuit $H_{A,m,2}$, a $Hold_{A,3}$ signal for controlling the opening and closing of the switch $SW_{13}$ provided between the readout circuit $R_{A,m}$ and the holding circuit $H_{A,m,3}$, a $Hold_{A,4}$ signal for controlling the opening and closing of the switch $SW_{14}$ provided between the readout circuit $R_{A,m}$ and the holding circuit $H_{A,m,4}$, a $Reset'_A$ signal for controlling the opening and closing of the switches provided between each input terminal of the adding and subtracting circuit S'$_A$ and the ground potential, a Shift$_{A,1}$ signal for controlling the opening and closing of the switches SW$_{21}$ to SW$_{24}$ provided between the holding circuits H$_{A,1,1}$ to H$_{A,1,4}$ and the adding and subtracting circuit S'$_A$, a Shift$_{A,2}$ signal for controlling the opening and closing of the switches SW$_{21}$ to SW$_{24}$ provided between the holding circuits H$_{A,2,1}$ to H$_{A,2,4}$ and the adding and subtracting circuit S'$_A$, a Shift$_{A,M}$ signal for controlling the opening and closing of the switches SW$_{21}$ to SW$_{24}$ provided between the holding circuits H$_{A,M,1}$ to H$_{A,M,4}$ and the adding and subtracting circuit S'$_A$, and a voltage value V$_{A,m}$ to be outputted from the adding and subtracting circuit S'$_A$ in this order from above.

Before the time $t_0$, the LED is in OFF state, and the Reset signal is at a high level, while the Trans signal at a low level, the Hold$_{A,1}$ signal at a low level, the Hold$_{A,2}$ signal at a low level, the Hold$_{A,3}$ signal at a low level, the Hold$_{A,4}$ signal at a low level, the Reset'$_A$ signal at a low level, and each Shift'$_A$ signal at a low level. The Reset signal shifts to a low level at the time $t_0$ and returns to a high level at the time $t_2$, which follows the time $t_0$. The Trans signal shifts to a high level at the time $t_1$, which follows the time $t_0$ but precedes the time $t_2$, and returns to a low level at the time $t_3$, which follows the time $t_2$. The LED becomes ON state at the time $t_3$.

Since the Reset signal is at a high level before the time $t_0$ and the Trans signal is at a low level from the time $t_0$ through $t_1$, the electric charge in the capacitive section C of the readout circuit R$_{A,m}$ is discharged to be in an initial state during the time period, whereby the voltage value in this initial state is to be outputted from the readout circuit R$_{A,m}$. The Hold$_{A,1}$ signal is at a high level during a certain time period between the time $t_0$ and $t_1$ to close the switch SW$_{11}$, whereby the output voltage value V$_{A,m,1}$ of the readout circuit R$_{A,m}$ during the time period is to be held by the holding circuit H$_{A,m,1}$. Since the capacitive section C of each readout circuit R$_{A,m}$ is in an initial state, the voltage value V$_{A,m,1}$ contains dark signal components.

Since the Reset signal is at a low level while the Trans signal is at a high level from the time $t_1$ through $t_2$, electric charge to be transferred from photodiodes in the photo-detecting section 10 through each line L$_{A,m}$ is to be held in the capacitive section C of the readout circuit R$_{A,m}$ to output a voltage value in accordance with the charge quantity from each readout circuit R$_{A,m}$. The Hold$_{A,2}$ signal is at a high level during a certain time period between the time $t_1$ and $t_2$ to close the switch SW$_{12}$, whereby the output voltage value V$_{A,m,2}$ of the readout circuit R$_{A,m}$ during the time period is to be held by the holding circuit H$_{A,m,2}$. Since the LED is in OFF state and the electric charge generated in photodiodes due to the incidence of background light into the photo-detecting section 10 is read out by the readout circuit R$_{A,m}$, the voltage value V$_{A,m,2}$ contains background light components and dark signal components.

Since the Reset signal is at a high level and the Trans signal is also at a high level from the time $t_2$ through $t_3$, the electric charge in the capacitive section C of the readout circuit R$_{A,m}$ is discharged to be in an initial state during the time period. Since the Trans signal is also at a high level, if there remains an electric charge after transfer in the photodiodes PD$_{A,m,1}$ to PD$_{A,m,N}$, the electric charge is also to be discharged to be in an initial state. Charge accumulation in the photodiodes PD$_{A,m,1}$ to PD$_{A,m,N}$ will be started at the time $t_3$.

From the time $t_3$ through $t_{10}$, the Reset signal is at a high level, while the Trans signal at a low level. The Reset signal shifts to a low level at the time $t_{10}$ and returns to a high level at the time $t_{12}$, which follows the time $t_{10}$. The Trans signal shifts to a high level at the time $t_{11}$, which follows the time $t_{10}$ but precedes the time $t_{12}$, and returns to a low level at the time $t_{13}$, which follows the time $t_{12}$. The LED is in an ON state from the time $t_3$ through before $t_{12}$.

Since the Reset signal is at a high level before the time $t_{10}$ and the Trans signal is at a low level from the time $t_{10}$ through $t_{11}$, the electric charge in the capacitive section C of the readout circuit R$_{A,m}$ is discharged to be in an initial state during the time period, whereby the voltage value in this initial state is to be outputted from the readout circuit R$_{A,m}$. The Hold$_{A,3}$ signal is at a high level during a certain time period between the time $t_{10}$ and $t_{11}$ to close the switch SW$_{13}$, whereby the output voltage value V$_{A,m,3}$ of the readout circuit R$_{A,m}$ during the time period is to be held by the holding circuit H$_{A,m,3}$. Since the capacitive section C of each readout circuit R$_{A,m}$ is in an initial state, the voltage value V$_{A,m,3}$ contains dark signal components.

Since the Reset signal is at a low level while the Trans signal is at a high level from the time $t_{11}$ through $t_{12}$, electric charge flowing from photodiodes through the line L$_{A,m}$ is to be held in the capacitive section C of the readout circuit R$_{A,m}$ to output a voltage value in accordance with the charge quantity from the readout circuit R$_{A,m}$. The Hold$_{A,4}$ signal is at a high level during a certain time period between the time $t_{11}$ and $t_{12}$ (however, while the LED is in an ON state) to close the switch SW$_{14}$, whereby the output voltage value V$_{A,m,4}$ of the readout circuit R$_{A,m}$ during the time period is to be held by the holding circuit H$_{A,m,4}$. Since the LED is in an ON state and the electric charge generated in photodiodes due to the incidence of LED light and background light into the photo-detecting section 10 is read out by the readout circuit R$_{A,m}$ the voltage value V$_{A,m,4}$ contains LED light components, background light components, and dark signal components.

Since the Reset signal is at a high level and the Trans signal is also at a high level from the time $t_{12}$ through $t_{13}$, the electric charge in the capacitive section C of the readout circuit R$_{A,m}$ is discharged to be in an initial state during the time period. Since the Trans signal is also at a high level, when there remains an electric charge after transfer in the photodiodes PD$_{A,m,1}$ to PD$_{A,m,N}$, the electric charge is also to be discharged to be in an initial state. Charge accumulation in the photodiodes PD$_{A,m,1}$ to PD$_{A,m,N}$ will be started at the time $t_{13}$.

Since the Reset signal is at a high level while the Trans signal is at a low level and the Hold$_{A,1}$, Hold$_{A,2}$, Hold$_{A,3}$, and Hold$_{A,4}$ signals are still at a low level from the time $t_{13}$ through $t_{20}$, the voltage values held in the respective holding circuits H$_{A,m,1}$ to H$_{A,m,4}$ will remain held without change. During this time period, the Reset'$_A$ signal is at a high level for a certain time period repeatedly M times. Then, during the time period in which the Reset'$_A$ signal is at a low level after the m-th high level, the Shift$_{A,m}$ signal is at a high level for a certain time period.

The Shift$_{A,m}$ signal being thus at a high level for a certain time period causes the switches SW$_{21}$ to SW$_{24}$ provided between the holding circuits H$_{A,m,1}$ to H$_{A,m,4}$ and the adding and subtracting circuit S'$_A$ to be closed, whereby the voltage value V$_{A,m,1}$ held in the holding circuit H$_{A,m,1}$ is to be inputted to the adding and subtracting circuit S'$_A$, the voltage value V$_{A,m,2}$ held in the holding circuit H$_{A,m,2}$ is to be inputted to the adding and subtracting circuit S'$_A$, the voltage value V$_{A,m,3}$ held in the holding circuit H$_{A,m,3}$ is to be inputted to the adding and subtracting circuit S'$_A$, and the voltage value V$_{A,m,4}$ held in the holding circuit H$_{A,m,4}$ is to be inputted to the subtracting circuit S$_A$. Then, a voltage value V$_{A,m}$ (=(V$_{A,m,3}$−V$_{A,m,4}$)−(V$_{A,m,1}$−V$_{A,m,2}$)) will be outputted from the output terminal of the adding and subtracting circuit S'$_A$.

Thus, the voltage values V$_{A,1}$ to V$_{A,M}$ will be sequentially outputted from the first signal processing section 23 to obtain the intensity distribution of incident light in the column direction in the two-dimensional array that is composed of the plurality of pixels. The voltage values $V_{A,m}$ obtained here represent LED light components at high accuracy with both background light components and dark signal components being removed. Also, calculating the respective differences $(V_{A,m,3}-V_{A,m,4})$ and $(V_{A,m,1}-V_{A,m,2})$ allows thermal noise (kTC noise), which is specific for CMOS circuitry, to be reduced. It is noted that the second signal processing section 33 may be operated during the same time period as above where the first signal processing section 23 is operated, or may be operated during a time period different from above. It is however preferable that the first and second signal processing sections 23 and 33 share the Reset signal as well as the Trans signal, and that the Hold$_{A,1}$ and Hold$_{B,1}$ signals correspond to each other, the Hold$_{A,2}$ and Hold$_{B,2}$ signals correspond to each other, the Hold$_{A,3}$ and Hold$_{B,3}$ signals correspond to each other, and the Hold$_{A,4}$ and Hold$_{B,4}$ signals correspond to each other. This arrangement causes the M readout circuits $R_{A,1}$ to $R_{A,M}$ and the N readout circuits $R_{B,1}$ to $R_{B,N}$ to be operated at the same timing, the M holding circuits $H_{A,1,1}$ to $H_{A,M,1}$ and the N holding circuits $H_{B,1,1}$ to $H_{B,N,1}$ to be operated at the same timing, the M holding circuits $H_{A,1,2}$ to $H_{A,M,2}$ and the N holding circuits $H_{B,1,2}$ to $H_{B,N,2}$ to be operated at the same timing, the M holding circuits $H_{A,1,3}$ to $H_{A,M,3}$ and the N holding circuits $H_{B,1,3}$ to $H_{B,N,3}$ to be operated at the same timing, and the M holding circuits $H_{A,1,4}$ to $H_{A,M,4}$ and the N holding circuits $H_{B,1,4}$ to $H_{B,N,4}$ to be operated at the same timing. It is therefore possible to measure the intensity distribution of incident light at the same timing in both the column and row directions that are at right angles to each other in the two-dimensional array composed of the pixels.

As described above, in the photo-detecting apparatus 3 according to the third embodiment, the M readout circuits $R_{A,m}$ included in the first signal processing section 23 can be operated at the same timing, the M holding circuits $H_{A,m,1}$ can be operated at the same timing, the M holding circuits $H_{A,m,2}$ can be operated at the same timing, the M holding circuits $H_{A,m,3}$ can be operated at the same timing, and the M holding circuits $H_{A,m,4}$ can be operated at the same timing. That is, electric charge to be outputted from the line Lm to which the N photodiodes $PD_{A,m,1}$ to $PD_{A,m,N}$ in the m-th row are connected can be read out at the same timing. The same applies to the second signal processing section 33. Accordingly, the photo-detecting apparatus 3 according to the third embodiment can obtain the intensity distribution of incident light at the same timing even when the intensity distribution of incident light may change with time.

Fourth Embodiment

Figure 17:
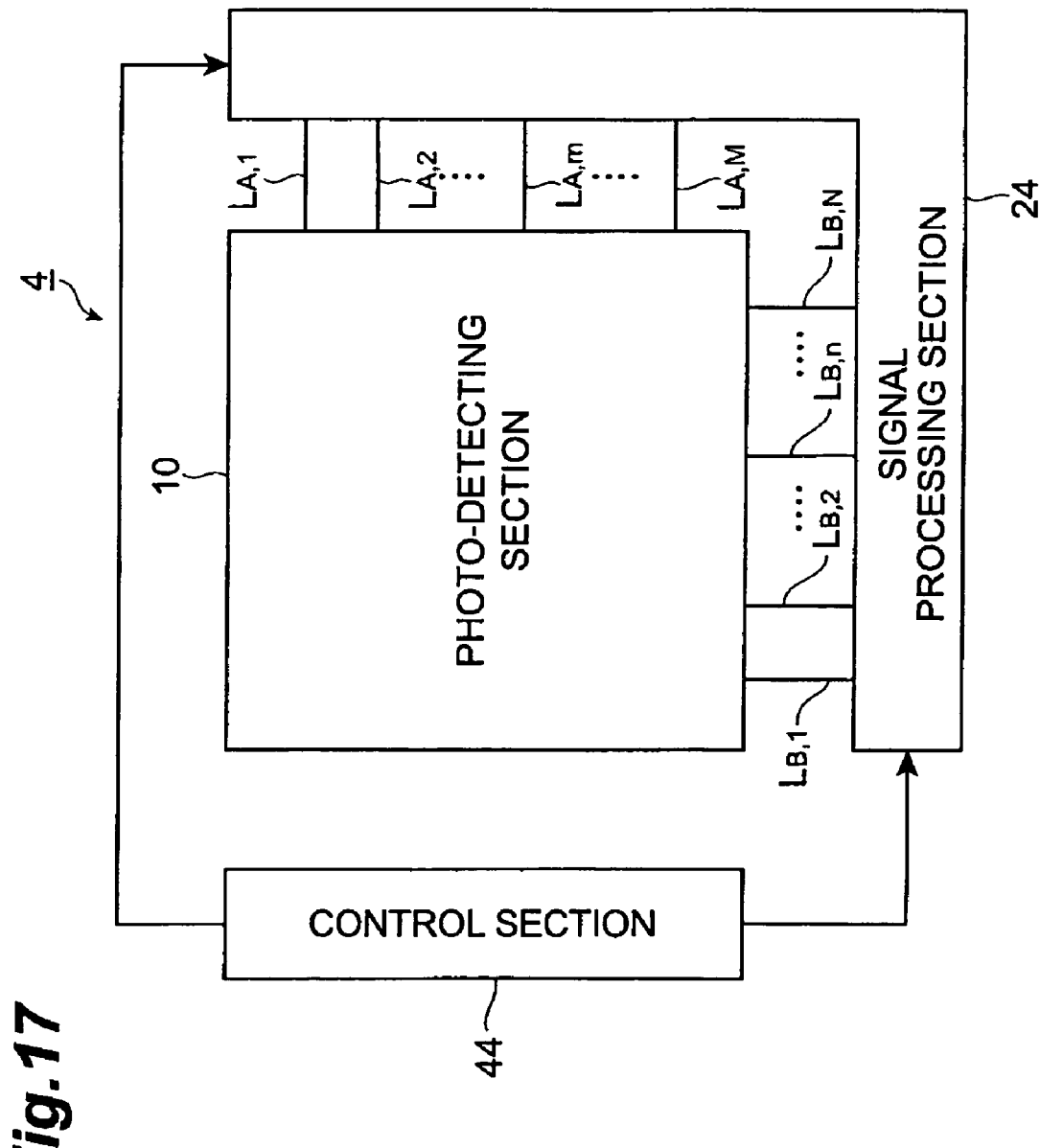
FIG. 17 is a view showing the schematic configuration of a fourth embodiment of a photo-detecting apparatus according to the present invention.

Next, a fourth embodiment of a photo-detecting apparatus according to the present invention will be explained. FIG. 17 is a view showing the schematic configuration of the photo-detecting apparatus 4 according to the fourth embodiment. As shown in FIG. 17, the photo-detecting apparatus 4 comprises a photo-detecting section 10, a signal processing section 24, and a control section 44. The photo-detecting section 10 has the same structure as in the first embodiment. The signal processing section 24 is electrically connected to the photo-detecting section 10 through M lines $L_{A,1}$ to $L_{A,M}$ and holds an electric charge to be transferred from photodiodes in the photo-detecting section 10 through each line $L_{A,m}$ as well as outputting a voltage value $V_{A,m}$ in accordance with the thus held charge quantity, and is electrically connected to the photo-detecting section 10 through N lines $L_{B,1}$ to $L_{B,N}$ and holds an electric charge to be transferred from photodiodes in the photo-detecting section 10 through each line $L_{B,n}$ as well as outputting a voltage value $V_{B,n}$ in accordance with the thus held charge quantity. The control section 44 controls the operation of the signal processing section 24.

Figure 18:
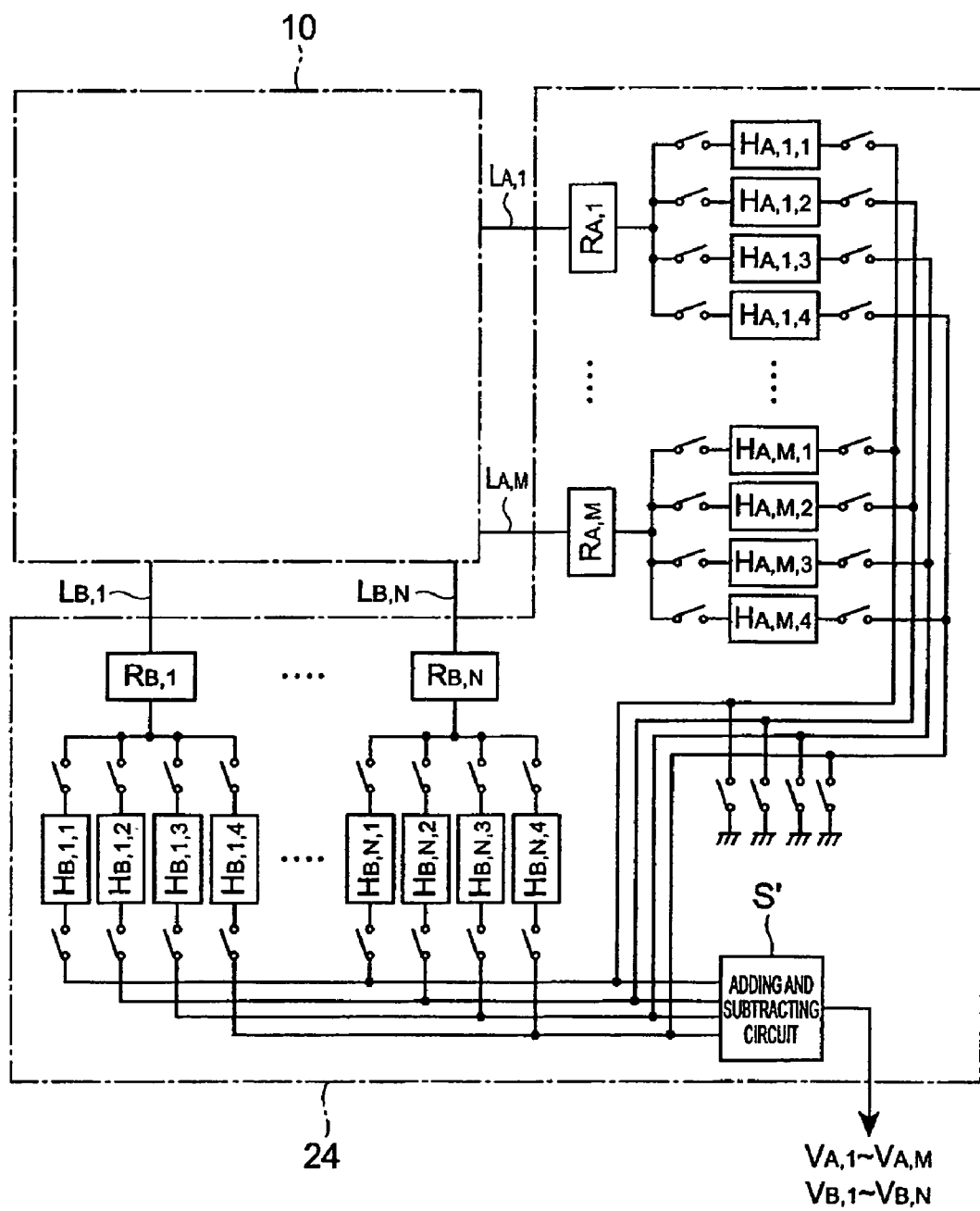
FIG. 18 is a view showing the configuration of a signal processing section in the photo-detecting apparatus according to the fourth embodiment.

FIG. 18 is a view showing the configuration of the signal processing section 24 in the photo-detecting apparatus 4 according to the fourth embodiment. In the photo-detecting apparatus 4, the signal processing section 24 includes M readout circuits $R_{A,1}$ to $R_{A,M}$, M holding circuits $H_{A,1,1}$ to $H_{A,M,1}$, M holding circuits $H_{A,1,2}$ to $H_{A,M,2}$, M holding circuits $H_{A,1,3}$ to $H_{A,M,3}$, M holding circuits $H_{A,1,4}$ to $H_{A,M,4}$, N readout circuits $R_{B,1}$ to $R_{B,N}$, N holding circuits $H_{B,1,1}$ to $H_{B,N,1}$, N holding circuits $H_{B,1,4}$ to $H_{B,N,2}$, N holding circuits $H_{B,1,3}$ to $H_{B,N,3}$, N holding circuits $H_{B,1,4}$ to $H_{B,N,4}$, and an adding and subtracting circuit S'. The signal processing section 24 has approximately the same configuration as that including both the first and second signal processing sections 23 and 33 of the photo-detecting apparatus 3 according to the third embodiment, with a difference in having one adding and subtracting circuit S' instead of the adding and subtracting circuits S'$_A$ and S'$_B$. It is noted that in this figure, signal lines for controlling the opening and closing of switches are omitted.

In the signal processing section 24, one of the holding circuits $H_{A,m,1}$ to $H_{A,m,4}$ holds a voltage value to be outputted from the readout circuit $R_{A,m}$, and one of the holding circuits $H_{B,n,1}$ to $H_{B,n,4}$ holds a voltage value to be outputted from the readout circuit $R_{B,n}$. Then, the adding and subtracting circuit S' receives a voltage value $V_{A,m,1}$ to be outputted from the holding circuit $H_{A,m,1}$, a voltage value $V_{A,m,2}$ to be outputted from the holding circuit $H_{A,m,2}$, a voltage value $V_{A,m,3}$ to be outputted from the holding circuit $H_{A,m,3}$, and a voltage value $V_{A,m,4}$ to be outputted from the holding circuit $H_{A,m,4}$ to output a voltage value $V_{A,m}$ representing the addition and subtraction of the voltage values $((V_{A,m,3}-V_{A,m,4})-(V_{A,m,1}-V_{A,m,2}))$. The adding and subtracting circuit S' also receives a voltage value $V_{B,n,1}$ to be outputted from the holding circuit $H_{B,n,1}$, a voltage value $V_{B,n,2}$ to be outputted from the holding circuit $H_{B,n,2}$, a voltage value $V_{B,n,3}$ to be outputted from the holding circuit $H_{B,n,3}$, and a voltage value $V_{B,n,4}$ to be outputted from the holding circuit $H_{B,n,4}$ to output a voltage value $V_{B,n}$ representing the addition and subtraction of the voltage values $((V_{B,n,3}-V_{B,n,4})-(V_{B,n,1}-V_{B,n,2}))$.

The operation of the photo-detecting apparatus 4 according to the fourth embodiment is approximately the same as that of the photo-detecting apparatus 3 according to the third embodiment, and it is therefore possible to measure the intensity distribution of incident light at the same timing in both the column and row directions that are at right angles to each other in the two-dimensional array composed of the pixels. However, in the photo-detecting apparatus 4, voltage values $V_{A,1}$ to $V_{A,M}$ and $V_{B,1}$ to $V_{B,N}$ are to be sequentially outputted from the one adding and subtracting circuit S'.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

INDUSTRIAL APPLICABILITY

The present invention relates to a photo-detecting apparatus comprising a photo-detecting section in which a plurality of pixels each having photodiodes are arranged in a two-dimensional array constituted by M rows and N columns, which makes it possible to obtain the intensity distribution of incident light at the same timing even when the intensity distribution of incident light may change with time.

The invention claimed is:

1. A photo-detecting apparatus comprising:

a photo-detecting section having: a plurality of pixels arranged in a two-dimensional array having M rows and N columns (M and N each represent an integer of 2 or more) and each having a first photodiode $PD_{A,m,n}$ and a second photodiode $PD_{B,m,n}$; a plurality of lines $L_{A,m}$ provided for the respective rows so that the N first photodiodes $PD_{A,m,1}$ to $PD_{A,m,N}$ included in the group of pixels constituting the m-th row ("m" represents any integer of 1 to M) of the two-dimensional array are electrically connected to each other through the line $L_{A,m}$; plurality of lines $L_{B,n}$ provided for the respective columns so that the M second photodiodes $PD_{B,1,n}$ to $PD_{B,M,n}$ included the group of pixels constituting the n-th column ("n" represents any integer of 1 to N) of the two-dimensional array are electrically connected to each other through the line $L_{B,n}$; and a signal processing section including M readout circuits $R_{A,1}$ to $R_{A,M}$ and N readout circuits $R_{B,1}$ to $R_{B,N}$, said signal processing section transferring an electric charge generated in said first photodiode $PD_{A,m,n}$ connected to said line $L_{A,m}$ into said readout circuit $R_{A,m}$ to output a voltage value in accordance with the charge quantity in said readout circuit $R_{A,m}$ while transferring an electric charge generated in said second photodiode $PD_{B,m,n}$ connected to said line $L_{B,n}$ into said readout circuit $R_{B,n}$ to output a voltage value in accordance with the charge quantity in said readout circuit $R_{B,n}$, wherein said signal processing section further includes M holding circuits $H_{A,1,1}$ to $H_{A,M,1}$, M holding circuits $H_{A,1,2}$ to $H_{A,M,2}$, M holding circuits $H_{A,1,3}$ to $H_{A,M,3}$, M holding circuits $H_{A,1,4}$ to $H_{A,M,4}$, N holding circuits $H_{B,1,1}$ to $H_{B,N,1}$, N holding circuits $H_{B,1,3}$ to $H_{B,N,3}$, N holding circuits $H_{B,1,4}$ to $H_{B,N,4}$, a first subtracting circuit, and a second subtracting circuit, wherein one of said holding circuit $H_{A,m,1}$, said holding circuit $H_{A,m,2}$, said holding circuit $H_{A,m,3}$, and said holding circuit $H_{A,m,4}$ holds a voltage value to be outputted from said readout circuit $R_{A,m}$, wherein one of said holding circuit $H_{B,n,1}$, said holding circuit $H_{B,n,2}$, said holding circuit $H_{B,n,3}$, and said holding circuit $H_{B,n,4}$ holds a voltage value to be outputted from said readout circuit $R_{B,n}$, wherein said first subtracting circuit receives a voltage value $V_{A,m,1}$ to be outputted from said holding circuit $H_{A,m,1}$, a voltage value $V_{A,m,2}$ to be outputted from said holding circuit $H_{A,m,2}$, a voltage value $V_{A,m,3}$ to be outputted from said holding circuit $H_{A,m,3}$, and a voltage value $V_{A,m,4}$ to be outputted from said holding circuit $H_{A,m,4}$ to output a voltage value representing the subtraction of the voltage values $((V_{A,m,3}-V_{A,m,4})-(V_{A,m,1}-V_{A,m,2}))$, and wherein said second subtracting circuit receives a voltage value $V_{B,n,1}$ to be outputted from said holding circuit $H_{B,n,1}$, a voltage value $V_{B,n,2}$ to be outputted from said holding circuit $H_{B,n,2}$, a voltage value $V_{B,n,3}$ to be outputted from said holding circuit $H_{B,n,3}$, and a voltage value $V_{B,n,4}$ to be outputted from said holding circuit $H_{B,n,4}$ to output a voltage value representing the subtraction of the voltage values $((V_{B,n,3}-V_{B,n,4})-(V_{B,n,1}-V_{B,n,2}))$.

2. A photo-detecting apparatus comprising:

a photo-detecting section having: a plurality of pixels arranged in a two-dimensional array having M rows and N columns (M and N each represent an integer of 2 or more) and each having a first photodiode $PD_{A,m,n}$ and a second photodiode $PD_{B,m,n}$; a plurality of lines $L_{A,m}$ provided for the respective rows so that the N first photodiodes $PD_{A,m,1}$ to $PD_{A,m,N}$ included in the group of pixels constituting the m-th row ("m" represents any integer of 1 to M) of the two-dimensional array are electrically connected to each other through the line $L_{A,m}$; and a plurality of lines $L_{B,n}$ provided for the respective columns so that the M second photodiodes $PD_{B,1,n}$ to $PD_{B,M,n}$ included in the group of pixels constituting the n-th column ("n" represents an integer of 1 to N) of the two-dimensional array are electrically connected to each other through the line $L_{B,n}$; and a signal processing section including M readout circuits $R_{A,1}$ to $R_{A,M}$ and N readout circuits $R_{B,1}$ to $R_{B,N}$, said signal processing section transferring an electric charge generated in said first photodiode $PD_{A,m,n}$ connected to said line $L_{A,m}$ into said readout circuit $R_{A,m}$ to output a voltage value in accordance with the charge quantity in said readout circuit $R_{A,m}$, while transferring an electric charge generated in said second photodiode $PD_{B,m,n}$ connected to said line $L_{B,n}$ into said readout circuit $R_{B,n}$ to output a voltage value in accordance with the charge quantity in said readout circuit $R_{B,n}$, wherein said signal processing section further includes M holding circuits $H_{A,1,1}$ to $H_{A,M,1}$, M holding circuits $H_{A,1,2}$ to $H_{A,M,2}$, M holding circuits $H_{A,1,3}$ to $H_{A,M,3}$, M holding circuits $H_{A,1,4}$ to $H_{A,M,4}$, N holding circuits $H_{B,1,1}$ to $H_{B,N,1}$, N holding circuits $H_{B,1,2}$ to $H_{B,N,2}$, N holding circuits $H_{B,1,3}$ to $H_{B,N,3}$, N holding circuits $H_{B,1,4}$ to $H_{B,N,4}$, and a subtracting circuit, wherein one of said holding circuit $H_{A,m,1}$, said holding circuit $H_{A,m,2}$, said holding circuit $H_{A,m,3}$, and said holding circuit $H_{A,m,4}$ holds a voltage value to be outputted from said readout circuit $R_{A,m}$, wherein one of said holding circuit $H_{B,n,1}$, said holding circuit $H_{B,n,2}$, said holding circuit $H_{B,n,3}$, and said holding circuit $H_{B,n,4}$ holds a voltage value to be outputted from said readout circuit $R_{B,n}$, and wherein said subtracting circuit receives a voltage value $V_{A,m,1}$ to be outputted from said holding circuit $H_{A,m,1}$, a voltage value $V_{A,m,2}$ to be outputted from said holding circuit $H_{A,m,2}$, a voltage value $V_{A,m,3}$ to be outputted from said holding circuit $H_{A,m,3}$, and a voltage value $V_{A,m,4}$ to be outputted from said holding circuit $H_{A,m,4}$ to output a voltage value representing said the subtraction of the voltage values $((V_{A,m,3}-V_{A,m,4})-(V_{A,m,1}-V_{A,m,2}))$ as well as receiving a voltage value $V_{B,n,1}$ to be outputted from said holding circuit $H_{B,n,1}$, a voltage value $V_{B,n,2}$ to be outputted from said holding circuit $H_{B,n,2}$, a voltage value $V_{B,n,3}$ to be outputted from said holding circuit $H_{B,n,3}$, and a voltage value $V_{B,n,4}$ to be outputted from said holding circuit $H_{B,n,4}$ to output a voltage value representing the subtraction of the voltage values $((V_{B,n,3}-V_{B,n,4})-(V_{B,n,1}-V_{B,n,2}))$.

* * * * *